United States Patent
Ohmaru et al.

(10) Patent No.: US 9,455,709 B2
(45) Date of Patent: Sep. 27, 2016

(54) SEMICONDUCTOR DEVICE

(71) Applicant: Semiconductor Energy Laboratory Co., Ltd., Kanagawa-ken (JP)

(72) Inventors: Takuro Ohmaru, Kanagawa (JP); Hidetomo Kobayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/638,250

(22) Filed: Mar. 4, 2015

(65) Prior Publication Data

US 2015/0263728 A1    Sep. 17, 2015

(30) Foreign Application Priority Data

Mar. 5, 2014   (JP) .................. 2014-042527

(51) Int. Cl.
| | |
|---|---|
| *H01L 27/12* | (2006.01) |
| *H03K 19/00* | (2006.01) |
| *H01L 29/786* | (2006.01) |
| *H01L 29/16* | (2006.01) |

(52) U.S. Cl.
CPC ....... *H03K 19/0008* (2013.01); *H01L 27/1207* (2013.01); *H01L 29/16* (2013.01); *H01L 29/7869* (2013.01)

(58) Field of Classification Search
CPC ... H01L 27/12; H01L 27/1207; H01L 29/16; H01L 29/7869; H01L 29/78696; H03K 19/0008
USPC .......................... 257/296, 351, 368, E27.016
See application file for complete search history.

(56) References Cited

U.S. PATENT DOCUMENTS

| | | | |
|---|---|---|---|
| 4,870,302 | A | 9/1989 | Freeman |
| 5,559,456 | A | 9/1996 | Hatsuda |
| 5,568,062 | A | 10/1996 | Kaplinsky |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Jimmy Vu
(74) *Attorney, Agent, or Firm* — Husch Blackwell LLP

(57) ABSTRACT

A dynamic logic circuit in which the number of elements is reduced, the layout area is reduced, the power loss is reduced, and the power consumption is reduced is provided. A semiconductor device including a dynamic logic circuit includes a first transistor in which a channel is formed in silicon and a second transistor in which a channel is formed in an oxide semiconductor. Here, a structure in which the second transistor is provided over the first transistor can be employed. A structure in which an insulating film is provided over the first transistor, and the second transistor is provided over the insulating film can be employed. A structure in which a top surface of the insulating film is planarized can be employed. A structure in which the second transistor has a region overlapping with the first transistor can be employed.

15 Claims, 12 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,982,197 A | 11/1999 | Ono et al. |
| 6,060,910 A | 5/2000 | Inui |
| 6,294,274 B1 | 9/2001 | Kawazoe et al. |
| 6,424,510 B1 | 7/2002 | Ajit et al. |
| 6,563,174 B2 | 5/2003 | Kawasaki et al. |
| 6,684,298 B1 | 1/2004 | Dwarkadas et al. |
| 6,727,522 B1 | 4/2004 | Kawasaki et al. |
| 6,812,787 B2 | 11/2004 | Kimura |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,257,678 B2 | 8/2007 | Golden et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,818,502 B2 | 10/2010 | Kurokawa |
| 8,970,253 B2 * | 3/2015 | Kurokawa ......... H03K 19/0013 326/38 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0184340 A1 | 9/2004 | Dwarkadas et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0091871 A1 | 4/2009 | Hung |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0293208 A1 * | 11/2012 | Kato ............... H03K 19/0963 326/102 |
| 2012/0293242 A1 | 11/2012 | Kato |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-244714 A | 9/1994 |
| JP | 06-296133 A | 10/1994 |
| JP | 08-264794 A | 10/1996 |
| JP | 08-274342 A | 10/1996 |
| JP | 10-022816 A | 1/1998 |
| JP | 11-068549 A | 3/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-320566 A | 11/2004 |
| JP | 2008-515095 | 5/2008 |
| JP | 2010-087911 A | 4/2010 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID DIgest'09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature". Appl. Phys. Lett. (Applied Physics Letters) , Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphouse In-Ga-Zn-Oxide TFT", AM-FPD '09 SID Digest of Technical Papers, Jul. 1, 2009, pp. 41-44.

Hayashi.R et al., "42.1: Invited Paper: Improved Amorphous In-Ga-Zn-O Tfts", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 29, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A at al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MO03 as a Charge-Generation Layer", Adv. Mater. (Advanced Materials), 2006, vol. 18, No. 3, pp. 339-342.

Kikuchi.H at al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU, or ZN] at Temperatures over 1000°C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID Internatioal Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2Zn04-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

(56) References Cited

OTHER PUBLICATIONS

Nomura.K at al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H at al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F at al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T at al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B. (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J at al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2o3-In2O3-ZnO) TFT", SID Digest '08 : SID International Symposium Digest of Technical Papers, May 20, 2008, vol. 39, pp. 633-636.

Takahashi.M et al., "Theoretical Analysis of Igzo Transparent Amorphous Oxide Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kimura, H. et al., "Ferroelectric-Based Functional Pass-Gate for Low-Power VLSI," 2002 Symposium on VLSI Circuits Digest of Technical Papers, Jun. 13, 2002, pp. 196-199, IEEE.

\* cited by examiner

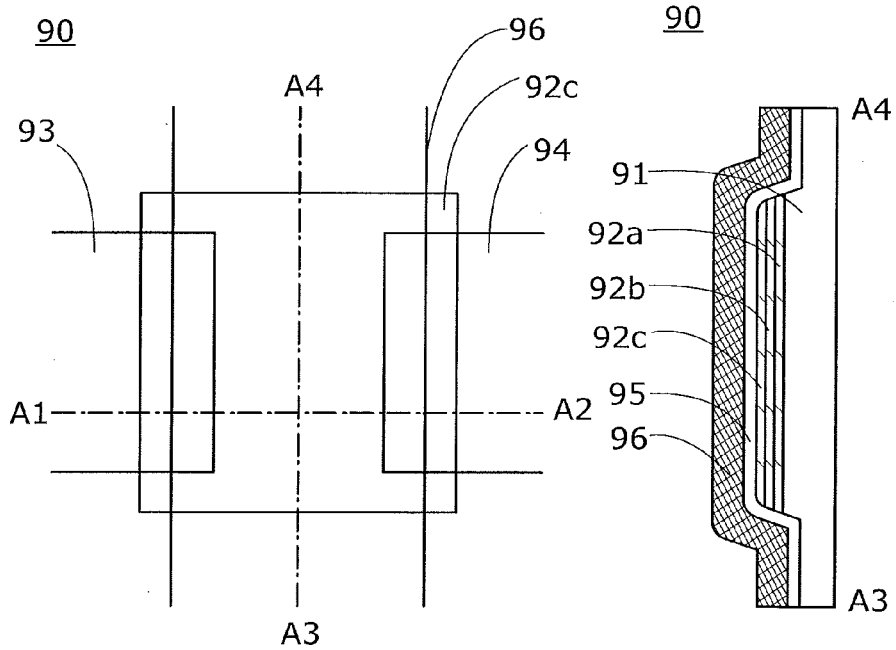
FIG. 10A
FIG. 10C
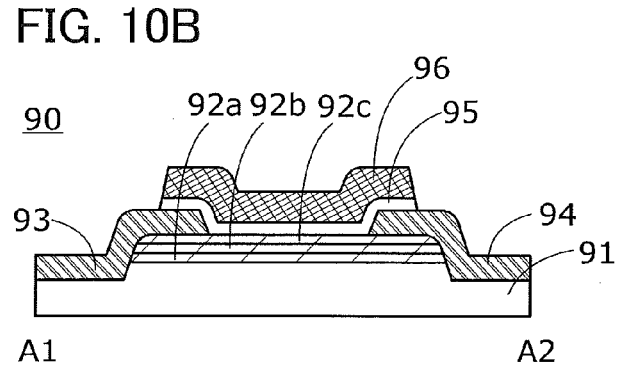
FIG. 10B

SEMICONDUCTOR DEVICE

BACKGROUND OF THE INVENTION

1. Field of the Invention

One embodiment of the present invention relates to a semiconductor device or a method for driving the same. One embodiment of the present invention relates to a dynamic logic circuit or a method for driving the same. One embodiment of the present invention relates to a domino logic circuit or a method for driving the same.

Note that one embodiment of the present invention is not limited to the above technical field. The technical field of the invention disclosed in this specification and the like relates to an object, a method, or a manufacturing method. Alternatively, the present invention relates to a process, a machine, manufacture, or a composition (a composition of matter). Thus, as an example of the technical field of one embodiment of the present invention specifically disclosed in this specification, a semiconductor device, a display device, a light-emitting device, a power storage device, a storage device, a signal processing device, a driving method thereof, or a manufacturing method thereof can be given.

2. Description of the Related Art

The demand for a reduction in power consumption and an increase in operation speed of a logic circuit has been increased. A domino logic circuit, which is a dynamic logic circuit, has attracted attention as a technique that enables high-speed operation.

An example of a domino logic circuit is illustrated in FIG. 7. A domino logic circuit 700 illustrated in FIG. 7 includes a transistor 771, a transistor 772, a transistor 773, a transistor 774, a transistor 775, an inverter 776, and an inverter 777. The transistor 771 and the transistor 772 are p-channel transistors. The transistor 773, the transistor 774, and the transistor 775 are n-channel transistors.

A signal PR is input to a gate of the transistor 771 and a gate of the transistor 775. A data signal DA is input to a gate of the transistor 773, and a data signal DB is input to a gate of the transistor 774. VH is a first potential, VL is a second potential, and VH is higher than VL.

In a first period, the transistor 771 is turned on, the transistor 775 is turned off, and the transistor 773 is turned off, whereby the potential of a node DN is brought close to VH. Note that when the potential of the node DN is close to VH, the potential of the node DN is input to a gate of the transistor 772 via the inverter 776; thus, the transistor 772 is turned on.

After the first period, the transistor 771 is turned off and the transistor 775 is turned on in a second period. A conduction state or a non-conduction state between the node DN and the transistor 775 is selected depending on the data signal DA and the data signal DB. In this manner, a result of logic operation of the data signal DA and the data signal DB is output as a potential of the node DN. The potential of the node DN, which corresponds to the result of the logic operation of the data signal DA and the data signal DB, is input to the subsequent stage via the inverter 777.

It is said that the domino logic circuit illustrated in FIG. 7 is capable of high-speed operation because only an n-channel transistor is used as a transistor to which the data signal is input. In addition, a potential corresponding to the data signal can be set on the basis of whether or not it exceeds the threshold voltage of the transistor; thus, driving at low voltage as compared to a static logic circuit is possible.

PRIOR ART DOCUMENT

Patent Document

[Patent Document 1] Japanese Published Patent Application No. H11-68549

SUMMARY OF THE INVENTION

A conventional dynamic logic circuit has a problem in that the layout area is increased because the number of elements is increased as compared to a static logic circuit. In addition, there is a problem in that power consumption is increased because of leakage and great power loss is caused with miniaturization of an element such as a transistor. In particular, a compensation circuit including the transistor 772 and the inverter 776, a capacitor connected to the node DN, and the like are substantially necessary components in order to compensate a reduction in the potential of the node DN due to leakage.

In view of the above, an object of one embodiment of the present invention is to provide a structure in which the number of elements is reduced as compared to a conventional dynamic logic circuit. An object of one embodiment of the present invention is to provide a structure in which the layout area is reduced as compared to a conventional dynamic logic circuit. An object of one embodiment of the present invention is to provide a structure in which power loss is reduced as compared to a conventional dynamic logic circuit. An object of one embodiment of the present invention is to provide a structure in which power consumption is reduced as compared to a conventional dynamic logic circuit. An object of one embodiment of the present invention is to provide a novel circuit. An object of one embodiment of the present invention is to provide a novel semiconductor device.

Note that the objects of the present invention are not limited to the above objects.

Note that the above objects do not disturb the existence of other objects. The other objects are objects that are not described in this section and are described below. The objects that are not described in this section are apparent from and can be derived from the description of the specification, the drawings, and the like by those skilled in the art.

Note that one embodiment of the present invention achieves at least one of the above objects and the other objects.

One embodiment of the present invention is a semiconductor device that includes a dynamic logic circuit, and the semiconductor device includes a first transistor in which a channel is formed in silicon and a second transistor in which a channel is formed in an oxide semiconductor. Here, a structure in which the second transistor is provided over the first transistor can be employed. A structure in which an insulating film is provided over the first transistor and the second transistor is provided over the insulating film can be employed. A structure in which a top surface of the insulating film is planarized can be employed. A structure in which the second transistor has a region overlapping with the first transistor can be employed. Note that the first transistor is not limited to the transistor in which a channel is formed in silicon. The first transistor may be a transistor in which a channel is formed in a compound semiconductor. For example, the first transistor may be a transistor in which a channel is formed in an oxide semiconductor.

A dynamic logic circuit is a logic circuit that performs arithmetic processing of a data signal by determining whether or not a charge of a precharged node is discharged in a proactive manner. The dynamic logic circuit may be a domino logic circuit.

One embodiment of the present invention is a semiconductor device that includes a first circuit, a second circuit, and a third circuit.

The first circuit includes a first terminal, a second terminal, and a third terminal and has a function of being capable of selecting a conduction state or a non-conduction state between the first terminal and the second terminal in accordance with a signal input to the third terminal. The first terminal is electrically connected to a first wiring that has a function of being capable of supplying a first potential.

The second circuit includes a fourth terminal, a fifth terminal, and a sixth terminal and has a function of being capable of selecting a conduction state or a non-conduction state between the fourth terminal and the fifth terminal in accordance with a data signal input to the sixth terminal. The fourth terminal is electrically connected to the second terminal.

The third circuit includes a seventh terminal, an eighth terminal, and a ninth terminal and has a function of being capable of selecting a conduction state or a non-conduction state between the seventh terminal and the eighth terminal in accordance with a signal input to the ninth terminal. The seventh terminal is electrically connected to the fifth terminal. The eighth terminal is electrically connected to a second wiring that has a function of being capable of supplying a second potential. The second potential can be a potential lower than the first potential.

When the first terminal and the second terminal are in a conduction state, a non-conduction state between the seventh terminal and the eighth terminal can be established; when the first terminal and the second terminal are in a non-conduction state, a conduction state between the seventh terminal and the eighth terminal can be established.

Note that the terms "wiring", "electrode", and "node" can be used instead of the term "terminal".

The first circuit includes a first transistor. The second circuit includes a second transistor. The third circuit includes a third transistor.

The first transistor can be a transistor in which a channel is formed in silicon. The second transistor can be a transistor in which a channel is formed in silicon. The third transistor can be a transistor in which a channel is formed in an oxide semiconductor. Note that at least one of the first transistor and the second transistor is not limited to the transistor in which a channel is formed in silicon and may be a transistor in which a channel is formed in a compound semiconductor. For example, it may be a transistor in which a channel is formed in an oxide semiconductor. A structure in which the third transistor is provided over at least one of the first transistor and the second transistor can be employed. A structure in which an insulating film is provided over the first transistor and the second transistor and the third transistor is provided over the insulating film can be employed. A structure in which a top surface of the insulating film is planarized can be employed. A structure in which the third transistor has a region overlapping with at least one of the first transistor and the second transistor can be employed.

Alternatively, the first transistor can be a transistor in which a channel is formed in silicon. The second transistor can be a transistor in which a channel is formed in an oxide semiconductor. The third transistor can be a transistor in which a channel is formed in silicon. Note that at least one of the first transistor and the third transistor is not limited to the transistor in which a channel is formed in silicon and may be a transistor in which a channel is formed in a compound semiconductor. For example, it may be a transistor in which a channel is formed in an oxide semiconductor. A structure in which the second transistor is provided over at least one of the first transistor and the third transistor can be employed. A structure in which an insulating film is provided over the first transistor and the third transistor and the second transistor is provided over the insulating film can be employed. A structure in which a top surface of the insulating film is planarized can be employed. A structure in which the second transistor has a region overlapping with at least one of the first transistor and the third transistor can be employed.

Alternatively, the first transistor can be a transistor in which a channel is formed in silicon. The second transistor can be a transistor in which a channel is formed in an oxide semiconductor. The third transistor can be a transistor in which a channel is formed in an oxide semiconductor. Note that the first transistor is not limited to the transistor in which a channel is formed in silicon and may be a transistor in which a channel is formed in a compound semiconductor. For example, it may be a transistor in which a channel is formed in an oxide semiconductor. A structure in which at least one of the second transistor and the third transistor is provided over the first transistor can be employed. A structure in which an insulating film is provided over the first transistor and the second transistor and the third transistor are provided over the insulating film can be employed. A structure in which a top surface of the insulating film is planarized can be employed. A structure in which at least one of the second transistor and the third transistor has a region overlapping with the first transistor can be employed.

In one embodiment of the present invention, a transistor in which a channel is formed in an oxide semiconductor is used in a dynamic logic circuit; thus, leakage current (also referred to as off-state current) of the transistor can be significantly reduced. Here, the off-state current of a transistor refers to current that flows between a source and a drain when an off state of the transistor is selected. In this manner, a compensation circuit that has been substantially necessary in a conventional dynamic logic circuit can be eliminated. In addition, a capacitor that has been substantially necessary in a conventional dynamic logic circuit can be eliminated, or the capacitance thereof can be reduced. In this manner, one embodiment of the present invention can provide a structure in which the number of elements is reduced as compared to a conventional dynamic logic circuit. One embodiment of the present invention can provide a structure in which power loss is reduced as compared to a conventional dynamic logic circuit. One embodiment of the present invention can provide a structure in which power consumption is reduced as compared to a conventional dynamic logic circuit. In addition, one embodiment of the present invention can provide a novel circuit. In addition, one embodiment of the present invention can provide a novel semiconductor device.

In addition, one embodiment of the present invention can make the layout area smaller than that of a conventional dynamic logic circuit by providing a plurality of transistors included in a dynamic logic circuit so that they overlap with each other. The layout area can be made to be smaller than that of a conventional dynamic logic circuit by, for example, providing a transistor in which a channel is formed in an oxide semiconductor and a transistor in which a channel is formed in silicon, which are included in a dynamic logic circuit, so that they overlap with each other.

Note that the effects of the present invention are not limited to the above effects. In addition, the above effects do not disturb the existence of other effects. The other effects are effects that are not described in this section and are described below. The effects that are not described in this section are apparent from and can be derived from the description of the specification, the drawings, and the like by those skilled in the art.

One embodiment of the present invention has at least one of the above effects and the other effects. Thus, one embodiment of the present invention does not have the above effects in some cases.

BRIEF DESCRIPTION OF THE DRAWINGS

FIGS. 10A-10C show views illustrating a structure of a transistor.

DETAILED DESCRIPTION OF THE INVENTION

Figure 1:
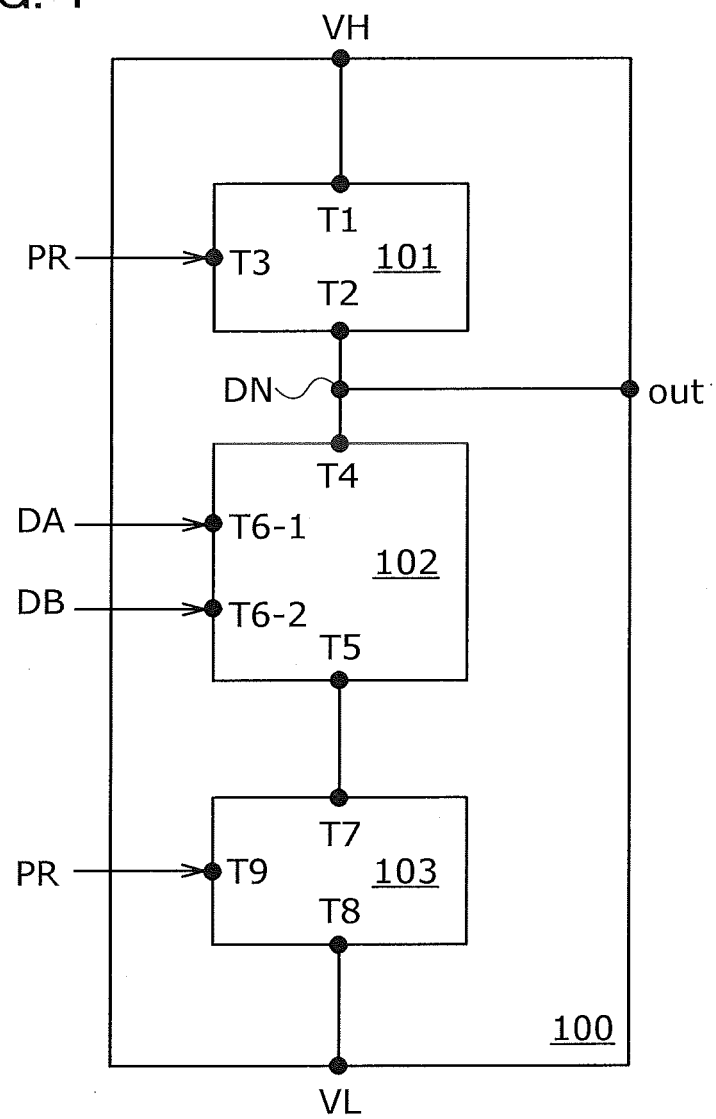
FIG. 1 shows a circuit diagram illustrating one embodiment of the present invention.

Hereinafter, embodiments are described with reference to the drawings. Note that the embodiments can be implemented in various different ways and it is easily understood by those skilled in the art that modes and details of the present invention can be modified in various ways without departing from the spirit and scope of the present invention. Therefore, the present invention should not be construed as being limited to the following description of the embodiments. Note that in structures of the present invention described below, reference numerals denoting the same portions are used in common in different drawings.

In addition, in the drawings, the size, the layer thickness, or the region is exaggerated for clarity in some cases. Therefore, embodiments of the present invention are not limited to such a scale. Note that the drawings schematically illustrate ideal examples, and there is no limitation to shapes or values illustrated in the drawings. For example, variation in signal, voltage, or current due to noise, or variation in signal, voltage, or current due to difference in timing can be included.

Moreover, in this specification and the like, a transistor is an element having at least three terminals: a gate, a drain, and a source. In addition, it includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a region functioning as a source and a region functioning as a drain are each not referred to as a source or a drain in some cases, and one of the source and the drain is referred to as a first terminal, and the other of the source and the drain is referred to as a second terminal in some cases.

Note that in this specification, ordinal numbers such as "first", "second", and "third" are used in order to avoid confusion among components, and thus do not limit the number of the components.

Note that in this specification, "A and B are connected" includes the case where A and B are electrically connected in addition to the case where A and B are directly connected. Here, "A and B are electrically connected" means the case where electric signals can be transmitted and received between A and B when an object having any electrical action exists between A and B.

Note that in this specification, terms for describing arrangement, such as "over" and "under", are used for convenience for describing the positional relation between components with reference to drawings. Furthermore, the positional relation between components is changed as appropriate in accordance with a direction in which each component is described. Thus, it can be described in different ways as appropriate in accordance with the situation without being limited to the term used in this specification.

Note that the layout of circuit blocks in a diagram specifies the positional relation for description, and even when a diagram illustrates that different functions are achieved in different circuit blocks, an actual circuit or region may be configured so that the different functions are achieved in the same circuit block. In addition, functions of circuit blocks in a diagram are specified for description, and even when one circuit block is illustrated, an actual circuit or region may be configured so that processing performed by one circuit block is performed in a plurality of circuit blocks.

Note that a voltage refers to a potential difference between a given potential and a reference potential (e.g., a ground potential) in many cases. Accordingly, the voltage, the potential, and the potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

Note that in general, a potential and a voltage are relative values. Therefore, a ground potential is not necessarily limited to 0 V.

Moreover, in this specification and the like, "parallel" means a state where two straight lines are arranged at an angle of greater than or equal to −10° and less than or equal to 10°. Thus, the case of an angle of greater than or equal to −5° and less than or equal to 5° is also included. In addition, "substantially parallel" means a state where two straight lines are arranged at an angle of greater than or equal to −30° and less than or equal to 30°. In addition, "perpendicular" means a state where two straight lines are arranged at an angle of greater than or equal to 80° and less than or equal to 100°. Thus, the case of an angle of greater than or equal to 85° and less than or equal to 95° is also included. In addition, "substantially perpendicular" means a state where two straight lines are arranged at an angle of greater than or equal to 60° and less than or equal to 120°.

Furthermore, in this specification and the like, the trigonal and rhombohedral crystal systems are included in the hexagonal crystal system.

Embodiment 1

In this embodiment, a dynamic logic circuit included in a semiconductor device of one embodiment of the present invention is described. A dynamic logic circuit 100 illustrated in FIG. 1 includes a first circuit 101, a second circuit 102, and a third circuit 103. The first circuit 101 can also be referred to as a precharge circuit. The second circuit can also be referred to as a logic circuit network. The third circuit 103 can also be referred to as a switch circuit. Note that the first circuit 101 and the third circuit 103 can also be collectively referred to as a precharge circuit.

The first circuit 101 includes a first terminal T1, a second terminal T2, and a third terminal T3 and has a function of being capable of selecting a conduction state or a non-conduction state between the first terminal T1 and the second terminal T2 in accordance with a signal PR input to the third terminal T3. The first terminal T1 is electrically connected to a first wiring having a function of being capable of supplying a first potential VH. The signal PR can also be referred to as a precharge signal.

The second circuit 102 includes a fourth terminal T4, a fifth terminal T5, and a sixth terminal T6 and has a function of being capable of selecting a conduction state or a non-conduction state between the fourth terminal T4 and the fifth terminal T5 in accordance with a data signal input to the sixth terminal T6. The fourth terminal T4 is electrically connected to the second terminal T2. A node at which the second terminal T2 and the fourth terminal T4 are connected is denoted by DN. The node DN serves as an output of the dynamic logic circuit 100. Note that the number of the sixth terminals T6 varies depending on a logic operation performed by the second circuit 102. In the structure illustrated in FIG. 1, the case where logic operations of two data signals (DA and DB) are performed is illustrated as an example, and the sixth terminal T6 is T6-1 and T6-2. The data signal DA is input to the terminal T6-1, and the data signal DB is input to the terminal T6-2.

The third circuit 103 includes a seventh terminal T7, an eighth terminal T8, and a ninth terminal T9 and has a function of being capable of selecting a conduction state or a non-conduction state between the seventh terminal T7 and the eighth terminal T8 in accordance with a signal PR input to the ninth terminal T9. The seventh terminal T7 is electrically connected to the fifth terminal T5. The eighth terminal T8 is electrically connected to a second wiring having a function of being capable of supplying a second potential VL. The second potential VL can be lower than the first potential VH.

When the first terminal T1 and the second terminal T2 are in a conduction state, a non-conduction state between the seventh terminal T7 and the eighth terminal T8 can be established; when the first terminal T1 and the second terminal T2 are in a non-conduction state, a conduction state between the seventh terminal T7 and the eighth terminal T8 can be established.

The first circuit 101 includes a first transistor. The second circuit 102 includes a second transistor. The third circuit 103 includes a third transistor.

The first transistor can be a transistor in which a channel is formed in silicon. The second transistor can be a transistor in which a channel is formed in silicon. The third transistor can be a transistor in which a channel is formed in an oxide semiconductor. Note that at least one of the first transistor and the second transistor is not limited to the transistor in which a channel is formed in silicon and may be a transistor in which a channel is formed in a compound semiconductor. For example, it may be a transistor in which a channel is formed in an oxide semiconductor. A structure in which the third transistor is provided over at least one of the first transistor and the second transistor can be employed. A structure in which an insulating film is provided over the first transistor and the second transistor and the third transistor is provided over the insulating film can be employed. A structure in which a top surface of an insulating film is planarized can be employed. A structure in which the third transistor has a region overlapping with at least one of the first transistor and the second transistor can be employed.

Alternatively, the first transistor can be a transistor in which a channel is formed in silicon. The second transistor can be a transistor in which a channel is formed in an oxide semiconductor. The third transistor can be a transistor in which a channel is formed in silicon. Note that at least one of the first transistor and the third transistor is not limited to the transistor in which a channel is formed in silicon and may be a transistor in which a channel is formed in a compound semiconductor. For example, it may be a transistor in which a channel is formed in an oxide semiconductor. A structure in which the second transistor is provided over at least one of the first transistor and the third transistor can be employed. A structure in which an insulating film is provided over the first transistor and the third transistor and the second transistor is provided over the insulating film can be employed. A structure in which the second transistor has a region overlapping with at least one of the first transistor and the third transistor can be employed.

Alternatively, the first transistor can be a transistor in which a channel is formed in silicon. The second transistor can be a transistor in which a channel is formed in an oxide semiconductor. The third transistor can be a transistor in which a channel is formed in an oxide semiconductor. Note that the first transistor is not limited to the transistor in which a channel is formed in silicon and may be a transistor in which a channel is formed in a compound semiconductor. For example, it may be a transistor in which a channel is formed in an oxide semiconductor. A structure in which at least one of the second transistor and the third transistor is provided over the first transistor can be employed. A structure in which an insulating film is provided over the first transistor and the second transistor and the third transistor are provided over the insulating film can be employed. A structure in which a top surface of the insulating film is planarized can be employed. A structure in which at least one of the second transistor and the third transistor has a region overlapping with the first transistor can be employed.

A method for driving the dynamic logic circuit 100 illustrated in FIG. 1 is described.

In a first period, the signal PR becomes a first signal potential to establish a conduction state between the first terminal T1 and the second terminal T2 and a conduction state between the seventh terminal T7 and the eighth terminal T8. In addition, a conduction state between the fourth terminal T4 and the fifth terminal T5 may be established by a data signal (e.g., the data signal DA and/or the data signal DB). In this manner, the potential of the node DN is brought close to VH.

After the first period, in a second period, the signal PR becomes a second signal potential to establish a non-conduction state between the first terminal T1 and the second terminal T2 and a conduction state between the seventh terminal T7 and the eighth terminal T8. In addition, a conduction state or a non-conduction state between the node DN and the seventh terminal T7 is selected in accordance with the data signal DA and the data signal DB. For example, when the conduction state between the node DN and the seventh terminal T7 is selected, the potential of the node DN is gradually decreased. Meanwhile, when the non-conduction state between the node DN and the seventh terminal T7 is selected, the potential of the node DN is hardly decreased. In this manner, results of logic operations of the data signal DA and the data signal DB are output as a potential of the node DN. The potential of the node DN, which corresponds to the results of the logic operations of the data signal DA and the data signal DB, can be input to a dynamic logic circuit in the next stage.

In such a manner, the dynamic logic circuit 100 illustrated in FIG. 1 can be driven.

Figure 7:
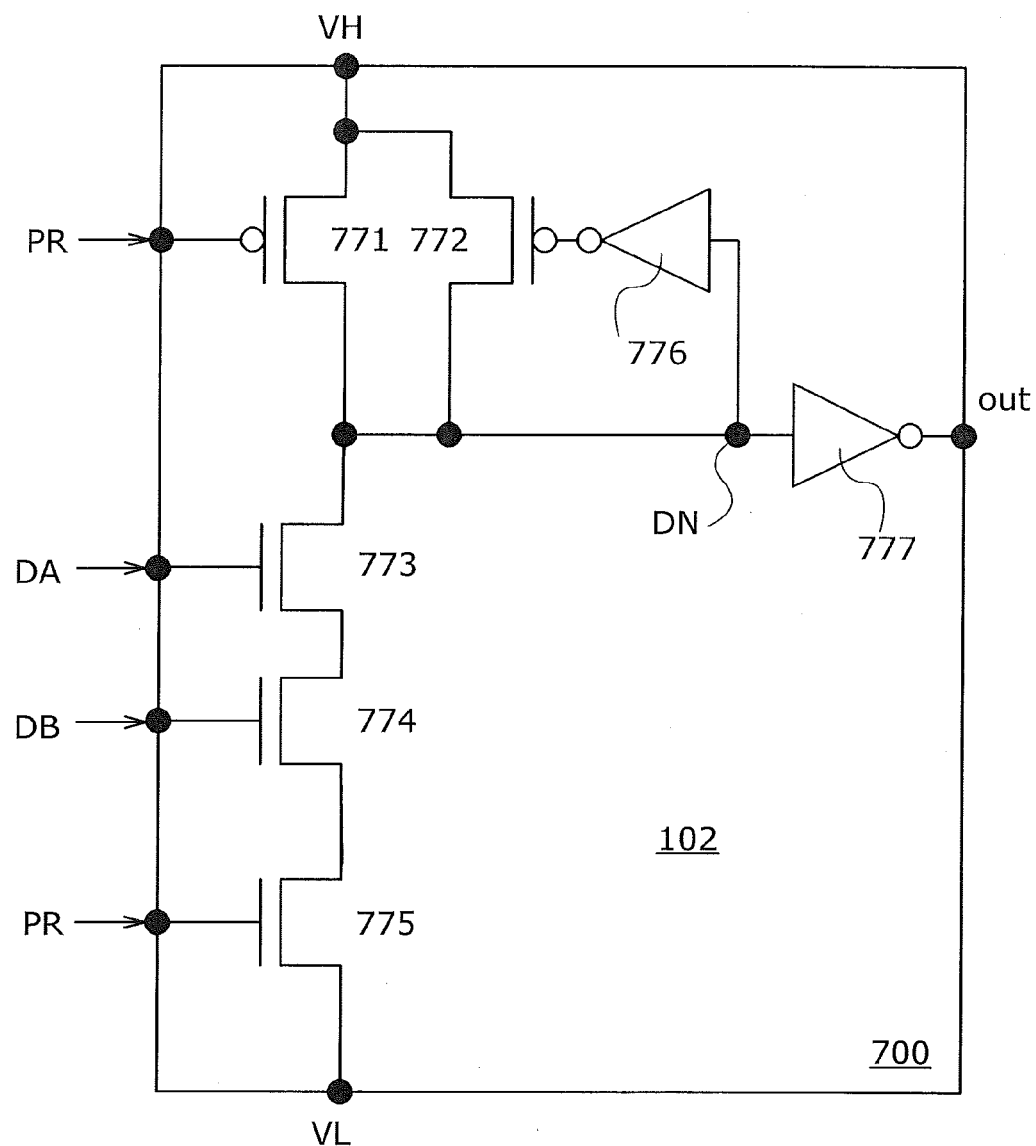
FIG. 7 shows a circuit diagram illustrating a conventional example.

When a transistor in which a channel is formed in an oxide semiconductor is used in a dynamic logic circuit, leakage current can be significantly reduced. Thus, a compensation circuit (e.g., the transistor 772 and the inverter 776 in FIG. 7) that has been substantially necessary in a conventional dynamic logic circuit can be eliminated. In addition, a capacitor (a capacitor connected to the node DN) that has been substantially necessary in a conventional dynamic logic circuit can be eliminated, or the capacitance thereof can be reduced. In this manner, one embodiment of the present invention can provide a structure in which the number of elements is reduced as compared to a conventional dynamic logic circuit. One embodiment of the present invention can provide a structure in which power loss is reduced as compared to a conventional dynamic logic circuit. One embodiment of the present invention can provide a structure in which power consumption is reduced as compared to a conventional dynamic logic circuit.

In addition, the layout area can be reduced as compared to a conventional dynamic logic circuit by providing a plurality of transistors included in the dynamic logic circuit so that they overlap with each other.

This embodiment can be implemented in free combination with any of the other embodiments.

Embodiment 2

Figure 2:
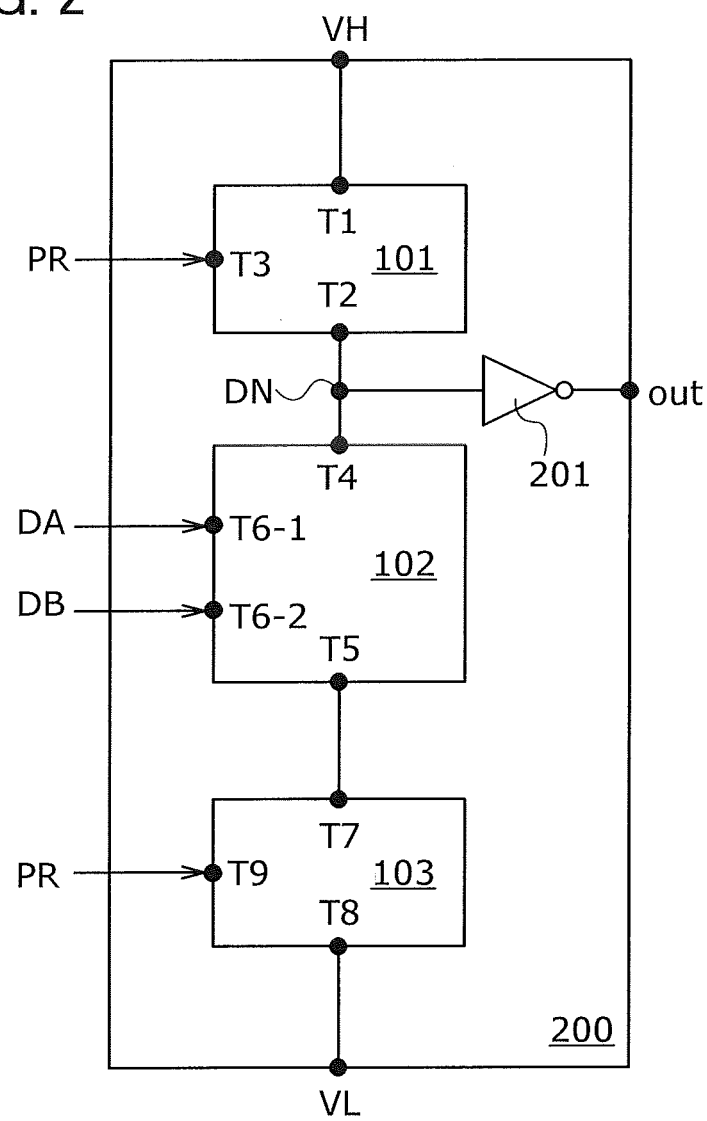
FIG. 2 shows a circuit diagram illustrating one embodiment of the present invention.

The dynamic logic circuit described in Embodiment 1 can be a domino logic circuit. FIG. 2 illustrates an example of each stage of a domino logic circuit. Note that the same portions as those in FIG. 1 are denoted by the same reference numerals and the description thereof is omitted.

The potential of a node DN is input to an inverter 201 to be an output signal out of a domino logic circuit 200. A configuration in which the output signal out is input as a data signal to a domino logic circuit in the next stage can be employed.

Here, the inverter 201 may be formed using a transistor in which a channel is formed in an oxide semiconductor. For example, the inverter 201 includes a p-channel transistor and an n-channel transistor, and the n-channel transistor can be a transistor in which a channel is formed in an oxide semiconductor. The p-channel transistor can be a transistor in which a channel is formed in silicon.

When a transistor in which a channel is formed in an oxide semiconductor is used in a domino logic circuit, leakage current can be significantly reduced. Thus, a compensation circuit (e.g., the transistor 772 and the inverter 776 in FIG. 7) that has been substantially necessary in a conventional domino logic circuit can be eliminated. In addition, a capacitor (a capacitor connected to the node DN) that has been substantially necessary in a conventional domino logic circuit can be eliminated, or the capacitance thereof can be reduced. In this manner, one embodiment of the present invention can provide a structure in which the number of elements is reduced as compared to a conventional domino logic circuit. One embodiment of the present invention can provide a structure in which power loss is reduced as compared to a conventional domino logic circuit. One embodiment of the present invention can provide a structure in which power consumption is reduced as compared to a conventional domino logic circuit.

In addition, the layout area can be reduced as compared to a conventional domino logic circuit by providing a plurality of transistors included in the domino logic circuit so that they overlap with each other.

This embodiment can be implemented in free combination with any of the other embodiments.

Embodiment 3

An example of a more specific structure of the dynamic logic circuit described in Embodiment 1 is described. In the dynamic logic circuit 100 illustrated in FIG. 3, the first circuit 101 includes at least a transistor 301. The second circuit 102 includes at least a transistor 302 and a transistor 303. The third circuit 103 includes at least a transistor 304. The transistor 301 can be a p-channel transistor. The transistor 302, the transistor 303, and the transistor 304 can be n-channel transistors.

One of a source and a drain of the transistor 301 is electrically connected to the first terminal T1, the other of the source and the drain of the transistor 301 is electrically connected to the second terminal T2, and a gate of the transistor 301 is electrically connected to the third terminal T3. Note that the first terminal T1 can also be referred to as the one of the source and the drain of the transistor 301. Note that the second terminal T2 can also be referred to as the other of the source and the drain of the transistor 301. The third terminal T3 can also be referred to as the gate of the transistor 301.

A gate of the transistor 302 is electrically connected to a sixth terminal T6-1. Note that the sixth terminal T6-1 can also be referred to as the gate of the transistor 302. A gate of the transistor 303 is electrically connected to a sixth terminal T6-2. The sixth terminal T6-2 can also be referred to as the gate of the transistor 303. A structure in which the transistor 302 and the transistor 303 are electrically connected to each other in series between the fourth terminal T4 and the fifth terminal T5 can be employed. Alternatively, a structure in which the transistor 302 and the transistor 303 are electrically connected to each other in parallel between the fourth terminal T4 and the fifth terminal T5 can be employed. Alternatively, a structure in which one of a source and a drain of the transistor 302 is electrically connected to the fourth terminal T4, the other of the source and the drain of the transistor 302 is electrically connected to the fifth terminal T5, one of the source and the drain of the transistor 303 is electrically connected to the fourth terminal T4, and the other of the source and the drain of the transistor 303 is electrically connected to the fifth terminal T5 can be employed. The number of transistors included in the second circuit 102 and the relation of electrical connection therebetween can be arbitrary depending on the logic operation performed by the second circuit 102.

One of a source and a drain of the transistor 304 is electrically connected to the seventh terminal T7, the other of the source and the drain of the transistor 304 is electrically connected to the eighth terminal T8, and a gate of the transistor 304 is electrically connected to the ninth terminal T9. Note that the seventh terminal T7 can also be referred to as the one of the source and the drain of the transistor 304. Note that the eighth terminal T8 can also be referred to as the other of the source and the drain of the transistor 304. The ninth terminal T9 can also be referred to as the gate of the transistor 304.

The transistor 301 can be a transistor in which a channel is formed in silicon. The transistor 302 and the transistor 303 can be a transistor in which a channel is formed in silicon. The transistor 304 can be a transistor in which a channel is formed in an oxide semiconductor. Note that at least one of the transistor 301, the transistor 302, and the transistor 303 is not limited to the transistor in which a channel is formed in silicon and may be a transistor in which a channel is formed in a compound semiconductor. For example, it may be a transistor in which a channel is formed in an oxide semiconductor. A structure in which the transistor 304 is provided over at least one of the transistor 301, the transistor 302, and the transistor 303 can be employed. A structure in which an insulating film is provided over the transistor 301, the transistor 302, and the transistor 303, and the transistor 304 is provided over the insulating film can be employed. A structure in which a top surface of the insulating film is planarized can be employed. A structure in which the transistor 304 has a region overlapping with at least one of the transistor 301, the transistor 302, and the transistor 303 can be employed.

Alternatively, the transistor 301 can be a transistor in which a channel is formed in silicon. The transistor 302 and the transistor 303 can be a transistor in which a channel is formed in an oxide semiconductor. The transistor 304 can be a transistor in which a channel is formed in silicon. Note that at least one of the transistor 301 and the transistor 304 is not limited to the transistor in which a channel is formed in silicon and may be a transistor in which a channel is formed in a compound semiconductor. For example, it may be a transistor in which a channel is formed in an oxide semiconductor. A structure in which the transistor 302 and the transistor 303 are provided over at least one of the transistor 301 and the transistor 304 can be employed. A structure in which an insulating film is provided over the transistor 301 and the transistor 304, and the transistor 302 and the transistor 303 are provided over the insulating film can be employed. A structure in which a top surface of the insulating film is planarized can be employed. A structure in which the transistor 302 and the transistor 303 have a region overlapping with at least one of the transistor 301 and the transistor 304 can be employed.

Alternatively, the transistor 301 can be a transistor in which a channel is formed in silicon. The transistor 302 and the transistor 303 can be a transistor in which a channel is formed in an oxide semiconductor. The transistor 304 can be a transistor in which a channel is formed in an oxide semiconductor. Note that the transistor 301 is not limited to the transistor in which a channel is formed in silicon and may be a transistor in which a channel is formed in a compound semiconductor. For example, it may be a transistor in which a channel is formed in an oxide semiconductor. A structure in which at least one of the transistor 302, the transistor 303, and the transistor 304 is provided over the transistor 301 can be employed. A structure in which an insulating film is provided over the transistor 301, and the transistor 302, the transistor 303, and the transistor 304 are provided over the insulating film can be employed. A structure in which a top surface of the insulating film is planarized can be employed. A structure in which at least one of the transistor 302, the transistor 303, and the transistor 304 has a region overlapping with the transistor 301 can be employed.

Figure 3:
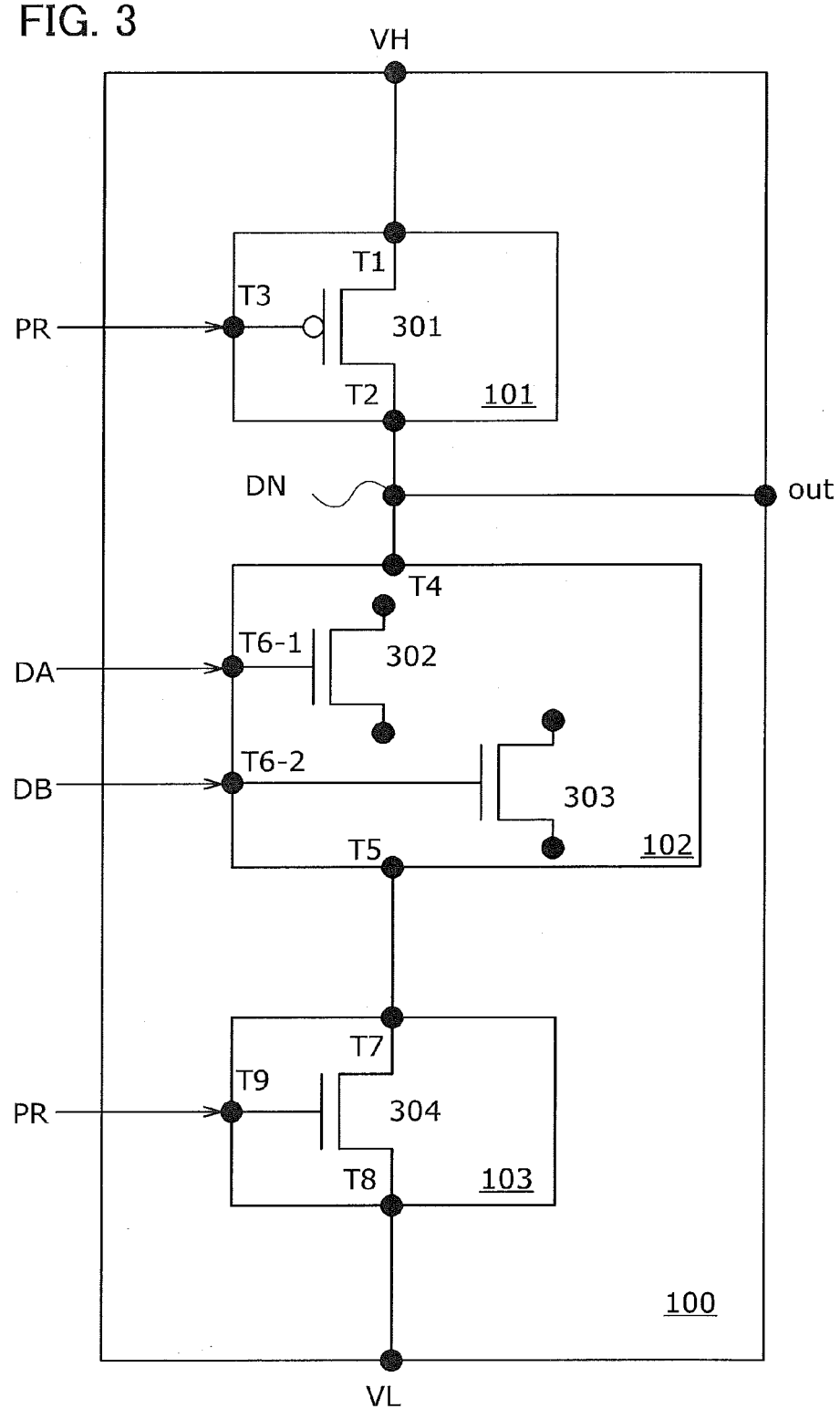
FIG. 3 shows a circuit diagram illustrating one embodiment of the present invention.

A method for driving the dynamic logic circuit 100 illustrated in FIG. 3 is similar to the method for driving the dynamic logic circuit illustrated in FIG. 1; thus, the description thereof is omitted.

When a transistor in which a channel is formed in an oxide semiconductor is used in a dynamic logic circuit, leakage current can be significantly reduced. Thus, a compensation circuit (e.g., the transistor 772 and the inverter 776 in FIG. 7) that has been substantially necessary in a conventional dynamic logic circuit can be eliminated. In addition, a capacitor (a capacitor connected to the node DN) that has been substantially necessary in a conventional dynamic logic circuit can be eliminated, or the capacitance thereof can be reduced. In this manner, one embodiment of the present invention can provide a structure in which the number of elements is reduced as compared to a conventional dynamic logic circuit. One embodiment of the present invention can provide a structure in which power loss is reduced as compared to a conventional dynamic logic circuit. One embodiment of the present invention can provide a structure in which power consumption is reduced as compared to a conventional dynamic logic circuit.

In addition, the layout area can be reduced as compared to a conventional dynamic logic circuit by providing a plurality of transistors included in the dynamic logic circuit so that they overlap with each other.

This embodiment can be implemented in free combination with any of the other embodiments.

Embodiment 4

Figure 4:
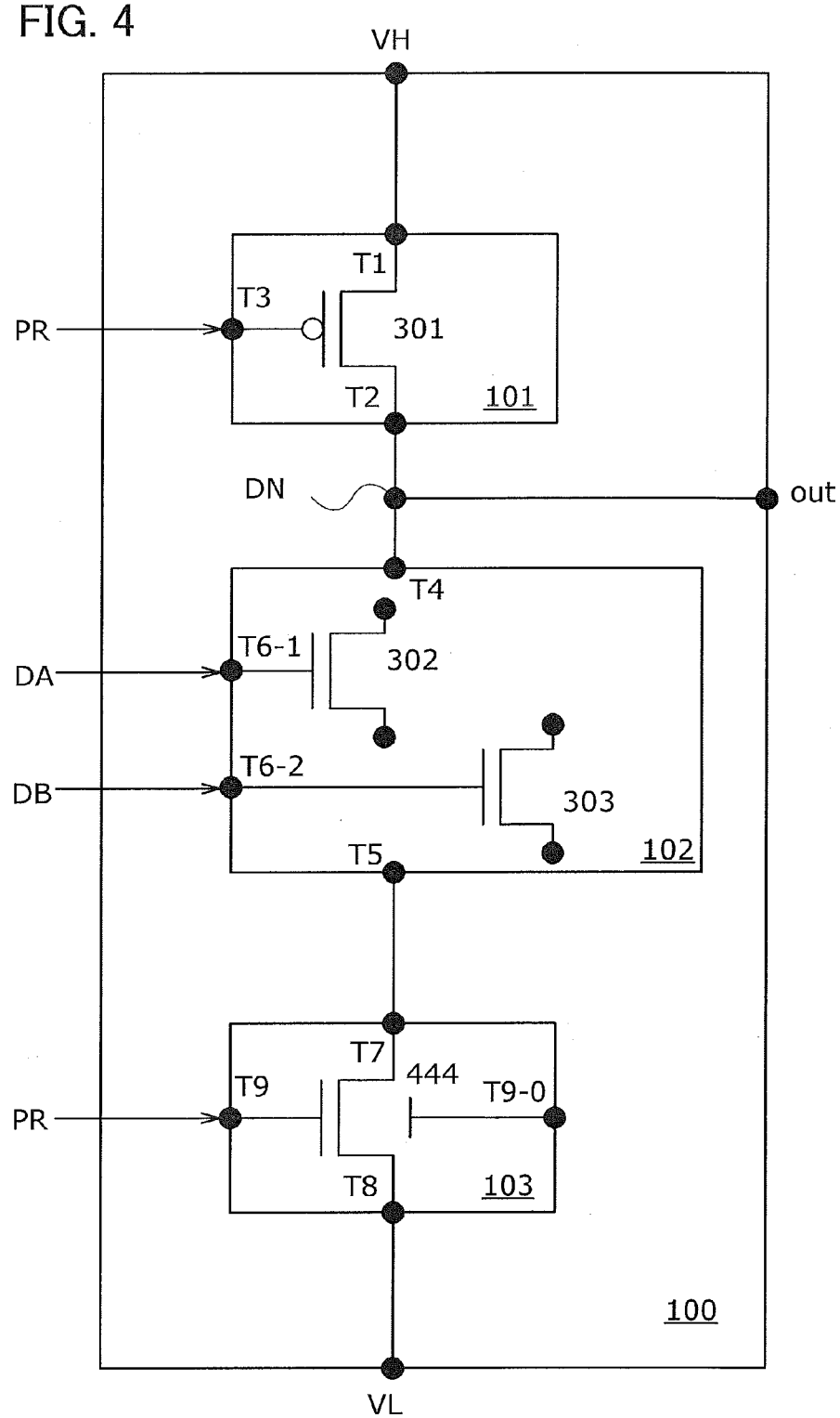
FIG. 4 shows a circuit diagram illustrating one embodiment of the present invention.

For the dynamic logic circuits illustrated in FIG. 1 and FIG. 3, a transistor 444 including gates that are provided over and under a semiconductor layer so that the semiconductor layer is interposed therebetween can be used as a transistor included in the third circuit 103 (e.g., the transistor 304 in FIG. 3) as in the dynamic logic circuit 100 illustrated in FIG. 4. In other words, a structure in which a first gate is provided under a semiconductor layer with an insulating film therebetween and a second gate is provided over the semiconductor layer with another insulating film therebetween can be employed. A structure in which one of the first gate and the second gate is electrically connected to the ninth terminal and the other of the first gate and the second gate is electrically connected to a "9-0"th terminal T9-0 can be employed.

A constant potential may be input to the "9-0"th terminal T9-0, a signal PR may be input, or a signal different from the signal PR may be input.

For example, in the case of driving of the dynamic logic circuit 100, the potential of a signal input to the "9-0"th terminal T9-0 is set to VS in a period (first period) in which a conduction state between the first terminal T1 and the second terminal T2 is established, a non-conduction state between the seventh terminal T7 and the eighth terminal T6 is established, and a non-conduction state between the fourth terminal T4 and the fifth terminal T5 is established, whereby the potential of the node DN is brought close to VH. Then, the potential of the signal input to the "9-0"th terminal T9-0 is set to VD in a period (second period) in which a non-conduction state between the first terminal T1 and the second terminal T2 is established, a conduction state between the seventh terminal T7 and the eighth terminal T6 is established, and a conduction state or a non-conduction state between the node DN and the seventh terminal T7 is selected in accordance with a data signal. The potential VS and the potential VD can be different potentials.

In the first period, the off-state current of the transistor 444 is preferably smaller in order to make the potential of the node DN closer to the potential VH. Meanwhile, in the second period, the on-state current of the transistor 444 is preferably larger in order to decrease the potential of the node DN more quickly in the case where a conduction state between the fourth terminal T4 and the fifth terminal T5 is established. Here, the on-state current of the transistor means current that flows between a source and a drain when an on state of the transistor is selected. Thus, in the case where the transistor 444 is an n-channel transistor, the potential VS and the potential VD are preferably set so that the apparent threshold voltage of the transistor 444 when the potential VS is input to the "9-0"th terminal T9-0 (first period) is higher than the apparent threshold voltage of the transistor 444 when the potential VD is input to the "9-0"th terminal T9-0 (second period). Here, the apparent threshold voltage of the transistor 444 corresponds to a potential of the ninth terminal T9 at which the transistor 444 is turned on. For example, the transistor 444 can be operated so that it is apparently normally-off (enhancement transistor) by the potential VS input to the "9-0"th terminal T9-0 in the first period, and the transistor 444 can be operated so that it is apparently normally-on (depletion transistor) by the potential VD input to the "9-0"th terminal T9-0 in the second period. In such a manner, higher speed and lower power consumption of the dynamic logic circuit 100 can be achieved.

In particular, a transistor in which a channel is formed in an oxide semiconductor is known to have small on-state current as compared to a transistor in which a channel is formed in silicon. For this reason, in the case where a transistor in which a channel is formed in an oxide semiconductor is used as the transistor 444, it is effective to achieve a reduction in the off-state current of the transistor 444 in the first period and an increase in the on-state current of the transistor 444 in the second period for the above-described structure.

This embodiment can be implemented in free combination with any of the other embodiments.

Embodiment 5

Figure 5:
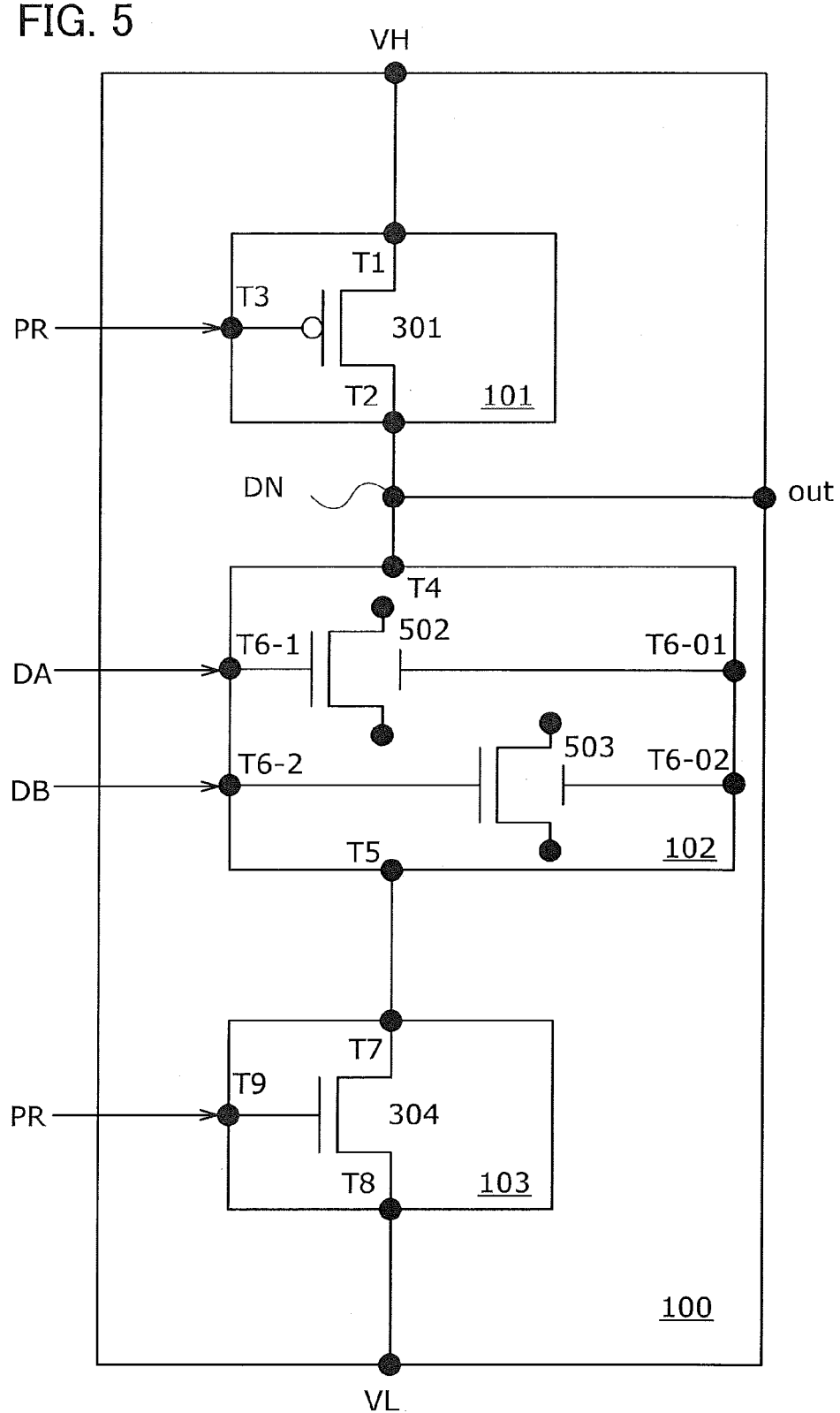
FIG. 5 shows a circuit diagram illustrating one embodiment of the present invention.

For the dynamic logic circuits illustrated in FIG. 1 and FIG. 3, a transistor 502 and a transistor 503 each including gates that are provided over and under a semiconductor layer so that the semiconductor layer is interposed therebetween can be used as a transistor included in the second circuit 102 (e.g., the transistor 302 or the transistor 303 in FIG. 3) as in the dynamic logic circuit 100 illustrated in FIG. 5. In other words, a structure in which a first gate is provided under a semiconductor layer with an insulating film therebetween and a second gate is provided over the semiconductor layer with another insulating film therebetween can be employed. A structure in which one of a first gate and a second gate of the transistor 502 is electrically connected to the sixth terminal T6-1 and the other of the first gate and the second gate is electrically connected to a "6-0"th terminal T6-01 can be employed. A structure in which one of a first gate and a second gate of the transistor 503 is electrically connected to the sixth terminal T6-2 and the other of the first gate and the second gate is electrically connected to a "6-0"th terminal T6-02 can be employed.

Here, the transistor 502 and the transistor 503 can have similar structures; thus, in the following description, the transistor 502 or the transistor 503 is denoted by a transistor 500, the sixth terminal T6-1 or the sixth terminal T6-2 is denoted by a sixth terminal T6, and the "6-0"th terminal T6-01 or the "6-0"th terminal T6-02 is denoted by a "6-0"th terminal T6-0.

A constant potential may be input to the "6-0"th terminal T6-0, a data signal may be input, or a signal different from the data signal may be input.

For example, in the case of driving of the dynamic logic circuit 100, the potential of a signal input to the "6-0"th terminal T6-0 is set to VSL in a period (first period) in which a conduction state between the first terminal T1 and the second terminal T2 is established, a non-conduction state between the seventh terminal T7 and the eighth terminal T6 is established, and a non-conduction state between the fourth terminal T4 and the fifth terminal T5 is established, whereby the potential of the node DN is brought close to VH. Then, the potential of the signal input to the "6-0"th terminal T6-0 is set to VDL in a period (second period) in which a non-conduction state between the first terminal T1 and the second terminal T2 is established, a conduction state between the seventh terminal T7 and the eighth terminal T6 is established, and a conduction state or a non-conduction state between the node DN and the seventh terminal T7 is selected in accordance with a data signal. The potential VSL and the potential VDL can be different potentials.

In the first period, the off-state current of the transistor 500 is preferably smaller in order to make the potential of the node DN closer to the potential VH. Meanwhile, in the second period, the on-state current of the transistor 500 is preferably larger in order to decrease the potential of the node DN more quickly in the case where a conduction state between the fourth terminal T4 and the fifth terminal T5 is established. Here, the on-state current of the transistor means current that flows between a source and a drain when an on state of the transistor is selected. Thus, in the case where the transistor 500 is an n-channel transistor, the potential VSL and the potential VDL are preferably set so that the apparent threshold voltage of the transistor 500 when the potential VSL is input to the "6-0"th terminal T6-0 (first period) is higher than the apparent threshold voltage of the transistor 500 when the potential VDL is input to the "6-0"th terminal T6-0 (second period). Here, the apparent threshold voltage of the transistor 500 corresponds to a potential of the sixth terminal T6 at which the transistor 500 is turned on. For example, the transistor 500 can be operated so that it is apparently normally-off (enhancement transistor) by the potential VSL input to the "6-0"th terminal T6-0 in the first period, and the transistor 500 can be operated so that it is apparently normally-on (depletion transistor) by the potential VDL input to the "6-0"th terminal T6-0 in the second period. In such a manner, higher speed and lower power consumption of the dynamic logic circuit 100 can be achieved.

In particular, a transistor in which a channel is formed in an oxide semiconductor is known to have small on-state current as compared to a transistor in which a channel is formed in silicon. For this reason, in the case where a transistor in which a channel is formed in an oxide semiconductor is used as the transistor 500, it is effective to achieve a reduction in the off-state current of the transistor 500 in the first period and an increase in the on-state current of the transistor 500 in the second period for the above-described structure.

This embodiment can be implemented in free combination with any of the other embodiments.

Embodiment 6

Figure 6:
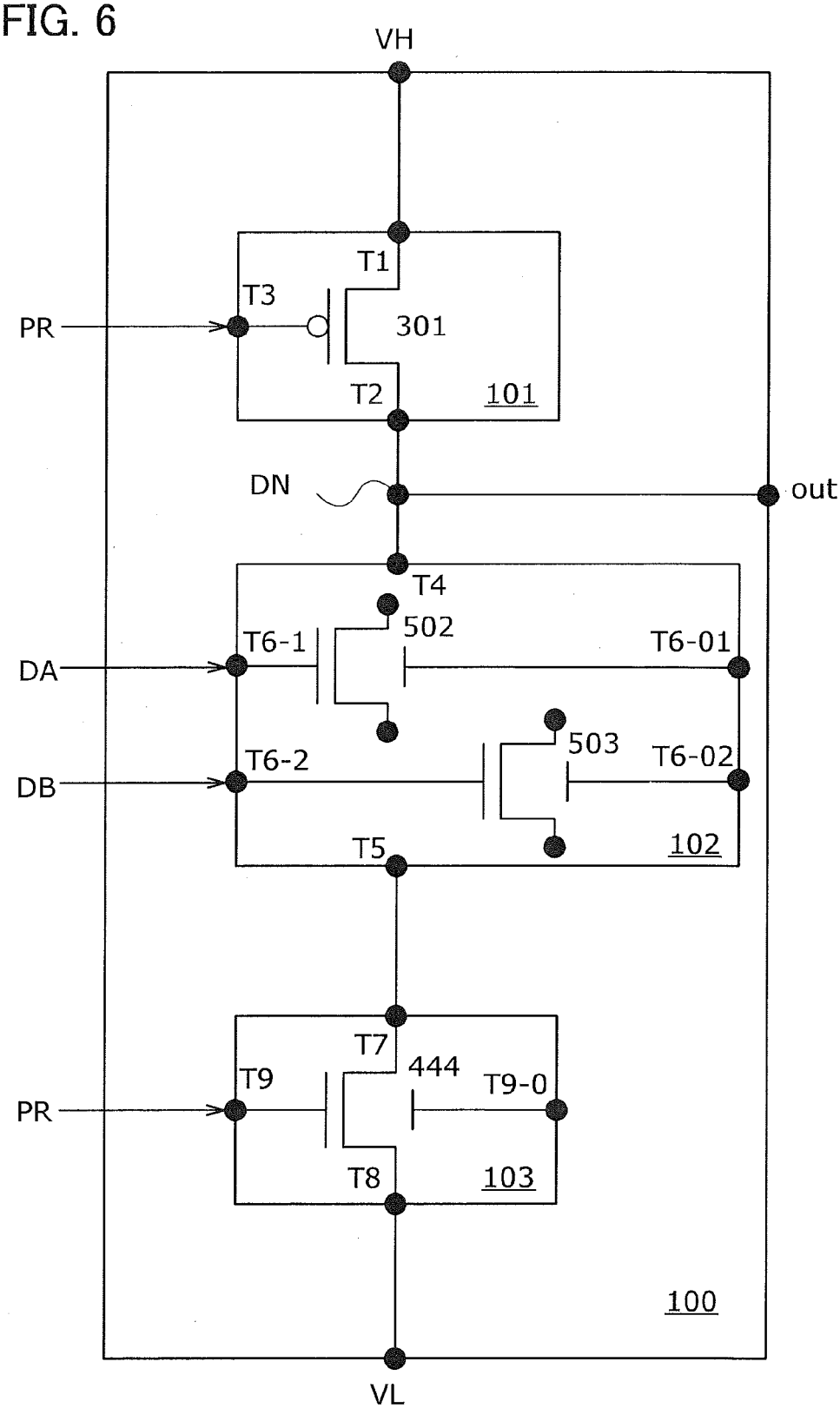
FIG. 6 shows a circuit diagram illustrating one embodiment of the present invention.

For the dynamic logic circuits illustrated in FIG. 1 and FIG. 3, a transistor 502 and a transistor 503 each including gates that are provided over and under a semiconductor layer so that the semiconductor layer is interposed therebetween can be used as a transistor included in the second circuit 102 (e.g., the transistor 302 or the transistor 303 in FIG. 3) as in the dynamic logic circuit 100 illustrated in FIG. 6. In addition, as the transistor (e.g., the transistor 304 in FIG. 3) included in the third circuit 103, the transistor 444 including gates that are provided over and under a semiconductor layer so that the semiconductor layer is interposed therebetween can be used.

Structures of and methods for driving the transistor 502 and the transistor 503 (collectively denoted by the transistor 500) and the transistor 444 can be similar to the structures and the driving methods described in Embodiment 4 and Embodiment 5.

In the case where the transistor 500 and the transistor 444 are n-channel transistors, a potential VDL input to the other of a first gate and a second gate of the transistor 500 (corresponding to the "6-0"th terminal T6-0) can be made higher than a potential VD input to the other of a first gate and a second gate of the transistor 444 (corresponding to the "9-0"th terminal T9-0) in the second period.

Since the second circuit 102 generally has a large number of transistors as compared to the third circuit 103, larger on-state current of each transistor and a quicker change in the potential of the node DN are required in the second period. In the case where the transistor 500 and the transistor 444 are n-channel transistors, further reduction in power consumption can be achieved by reducing the potential VD while further increase in the operation speed of the dynamic logic circuit 100 can be achieved by making the potential VDL higher than the potential VD.

This embodiment can be implemented in free combination with any of the other embodiments.

Embodiment 7

Figure 8:
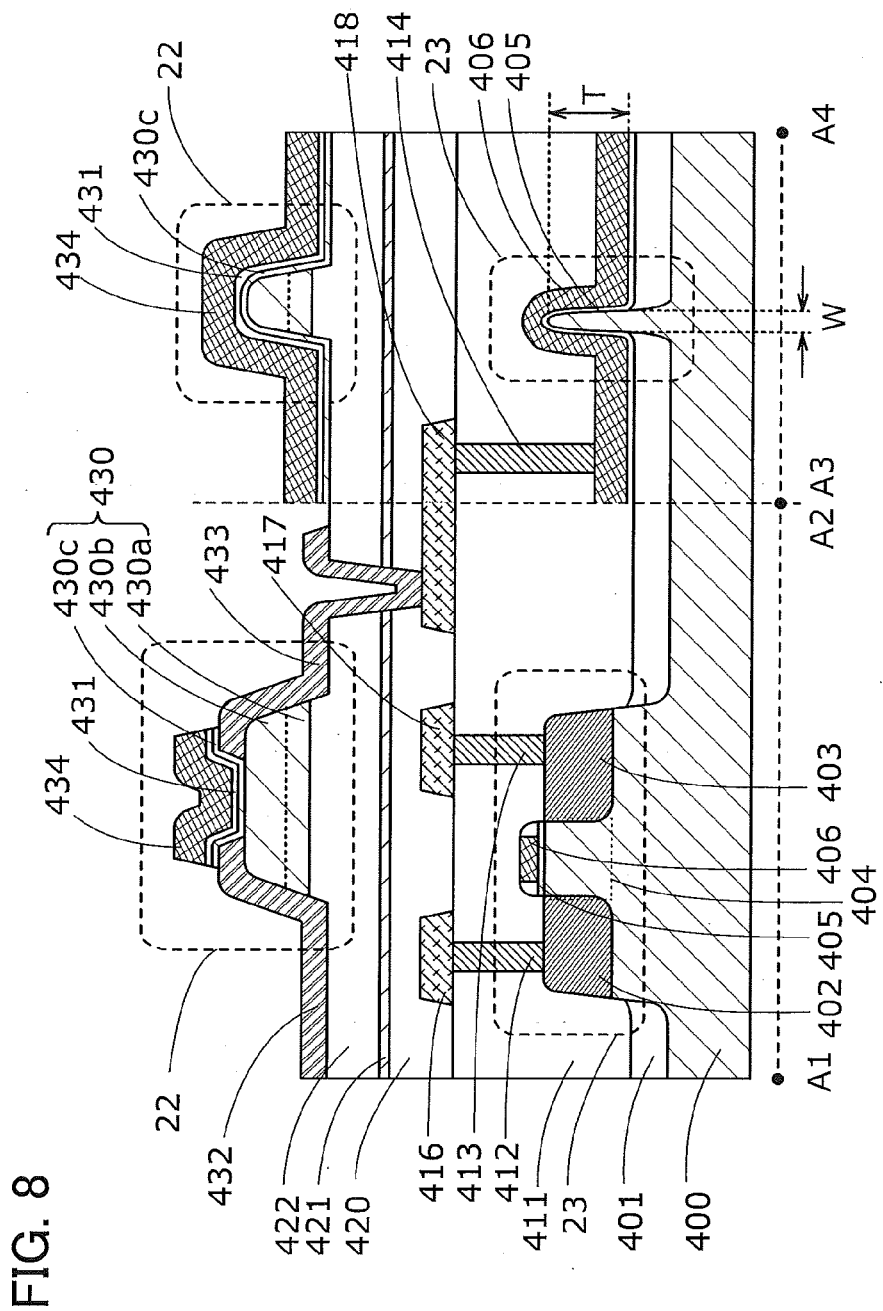
FIG. 8 shows a view illustrating a cross-sectional structure of a semiconductor device.

FIG. 8 illustrates an example of a cross-sectional structure of a semiconductor device that includes the dynamic logic circuits illustrated in FIG. 1 to FIG. 6. A transistor in which a channel is formed in an oxide semiconductor among transistors including the dynamic logic circuit is illustrated as a transistor 22. A transistor in which a channel is formed in silicon among transistors including the dynamic logic circuit is illustrated as a transistor 23. The transistor 22 is provided over the transistor 23.

Note that in a region indicated by dashed line A1-A2, a structure of the transistor 22 in which a channel is formed in an oxide semiconductor in the channel length direction and a structure of the transistor 23 in which a channel is formed in silicon in the channel length direction are shown; in a region indicated by dashed line A3-A4, a structure of the transistor 22 in which a channel is formed in an oxide semiconductor in the channel width direction and a structure of the transistor 23 in which a channel is formed in silicon are shown. Note that in one embodiment of the present invention, the channel length direction of one transistor is not necessarily aligned with the channel length direction of another transistor.

Note that the channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate.

The transistor 23 can be a transistor in which a channel is formed in a single crystal silicon substrate. Note that the transistor 23 may be a transistor in which a channel is formed in a semiconductor film or a semiconductor substrate of silicon, germanium, or the like that is amorphous, microcrystalline, polycrystalline, or single crystal. In the case where the transistor 23 is formed using a thin silicon film, amorphous silicon formed by a vapor phase growth method such as a plasma-enhanced CVD method or a sputtering method, polycrystalline silicon obtained by crystallization of amorphous silicon by treatment such as laser annealing, single crystal silicon obtained by separation of a surface portion by implantation of hydrogen ions or the like into a single crystal silicon wafer, or the like can be used.

The transistor 23 may include a channel formation region in an oxide semiconductor film or an oxide semiconductor substrate. In the case where all transistors included in the semiconductor device each include a channel formation region in an oxide semiconductor film or an oxide semiconductor substrate, the transistor 22 is not necessarily stacked over the transistor 23, and the transistor 22 and the transistor 23 may be formed in the same layer.

As a substrate 400 where the transistor 23 is formed, for example, a silicon substrate, a germanium substrate, a silicon germanium substrate, or the like can be used. In FIG. 8, the case where a single crystal silicon substrate is used as the substrate 400 is illustrated as an example.

In addition, the transistor 23 is electrically isolated from an adjacent transistor by an element isolation method. As the element isolation method, a local oxidation of silicon method (LOCOS method: Local Oxidation of Silicon method), a shallow trench isolation method (STI method: Shallow Trench Isolation), or the like can be employed. FIG. 8 illustrates, as an example, the case where the transistor 23 is electrically isolated by a trench isolation method. Specifically, FIG. 8 illustrates, as an example, the case where the transistor 23 is isolated by element isolation using an element isolation region 401 formed in such a manner that an insulator including silicon oxide or the like is buried in a trench formed in the substrate 400 by etching or the like and then the insulator is removed partly by etching or the like.

In addition, in a projection portion of the substrate 400 that exists in a region other than the trench, an impurity region 402 and an impurity region 403 of the transistor 23 and a channel formation region 404 interposed between the impurity region 402 and the impurity region 403 are provided. Furthermore, the transistor 23 includes an insulating film 405 that covers the channel formation region 404 and a gate electrode 406 that overlaps with the channel formation region 404 with the insulating film 405 interposed therebetween.

In the transistor 23, a side portion and an upper portion of the projection portion in the channel formation region 404 overlap with the gate electrode 406 with the insulating film 405 interposed therebetween, so that carriers flow in a wide area including the side portion and the upper portion of the channel formation region 404. Thus, the number of transferred carriers in the transistor 23 can be increased while an area over the substrate occupied by the transistor 23 can be reduced. As a result, the on-state current of the transistor 23 is increased and the field-effect mobility of is increased. Suppose the length in the channel width direction (channel width) of the projection portion in the channel formation region 404 is W, and the thickness of the projection portion in the channel formation region 404 is T; when the aspect ratio of the thickness T to the channel width W is high, an area where carriers flow becomes larger; thus, the on-state current of the transistor 23 can be further increased and the field-effect mobility can be further increased.

Note that in the case of the transistor 23 using a bulk semiconductor substrate, the aspect ratio is preferably 0.5 or more, further preferably 1 or more.

An insulating film 411 is provided over the transistor 23. Openings are formed in the insulating film 411. In addition, a conductive film 412 and a conductive film 413 that are electrically connected to the impurity region 402 and the impurity region 403, respectively, and a conductive film 414 that is electrically connected to the gate electrode 406 are formed in the openings.

In addition, the conductive film 412 is electrically connected to a conductive film 416 formed over the insulating film 411, the conductive film 413 is electrically connected to a conductive film 417 formed over the insulating film 411, and the conductive film 414 is electrically connected to a conductive film 418 formed over the insulating film 411.

An insulating film 420 is provided over the conductive film 416 to the conductive film 418. In addition, an insulating film 421 that has an effect of blocking diffusion of oxygen, hydrogen, water, and the like is provided over the insulating film 420. As the insulating film 421 has higher density and becomes denser or has a fewer dangling bonds and becomes more chemically stable, it has a higher blocking effect. For the insulating film 421 that has the effect of blocking diffusion of oxygen, hydrogen, and water, for example, aluminum oxide, aluminum oxynitride, gallium oxide, gallium oxynitride, yttrium oxide, yttrium oxynitride, hafnium oxide, hafnium oxynitride, or the like can be used. For the insulating film 421 that has an effect of blocking diffusion of hydrogen and water, for example, silicon nitride, silicon nitride oxide, or the like can be used.

An insulating film 422 is provided over the insulating film 421, and the transistor 22 is provided over the insulating film 422.

The transistor 22 includes, over the insulating film 422, a semiconductor film 430 including an oxide semiconductor, a conductive film 432 and a conductive film 433 functioning as a source electrode or a drain electrode and electrically connected to the semiconductor film 430, a gate insulating film 431 covering the semiconductor film 430, and a gate electrode 434 overlapping with the semiconductor film 430 with the gate insulating film 431 interposed therebetween. Note that an opening portion is formed in the insulating film 420 to the insulating film 422, and the conductive film 433 is connected to the conductive film 418 in the opening portion.

Note that in FIG. 8, the transistor 22 may include the gate electrode 434 on at least one side of the semiconductor film 430; alternatively, it may include a gate electrode overlapping with the semiconductor film 430 with the insulating film 422 interposed therebetween.

In the case where the transistor 22 includes a pair of gate electrodes, one of the gate electrodes may be supplied with a signal for controlling the on state or the off state, and the other of the gate electrodes may be supplied with a potential from another element. In this case, potentials with the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

In addition, FIG. 8 illustrates, as an example, the case where the transistor 22 has a single-gate structure where one channel formation region corresponding to one gate electrode 434 is provided. However, the transistor 22 may have a multi-gate structure where a plurality of electrically connected gate electrodes are provided so that a plurality of channel formation regions are included in one active layer.

Moreover, FIG. 8 illustrates, as an example, the case where the semiconductor film 430 in the transistor 22 includes an oxide semiconductor film 430a to an oxide semiconductor film 430c that are stacked in this order over the insulating film 422. Note that in one embodiment of the present invention, the semiconductor film 430 included in the transistor 22 may be formed using a single-layer metal oxide film.

This embodiment can be implemented in free combination with any of the other embodiments.

Embodiment 8

Figure 11:
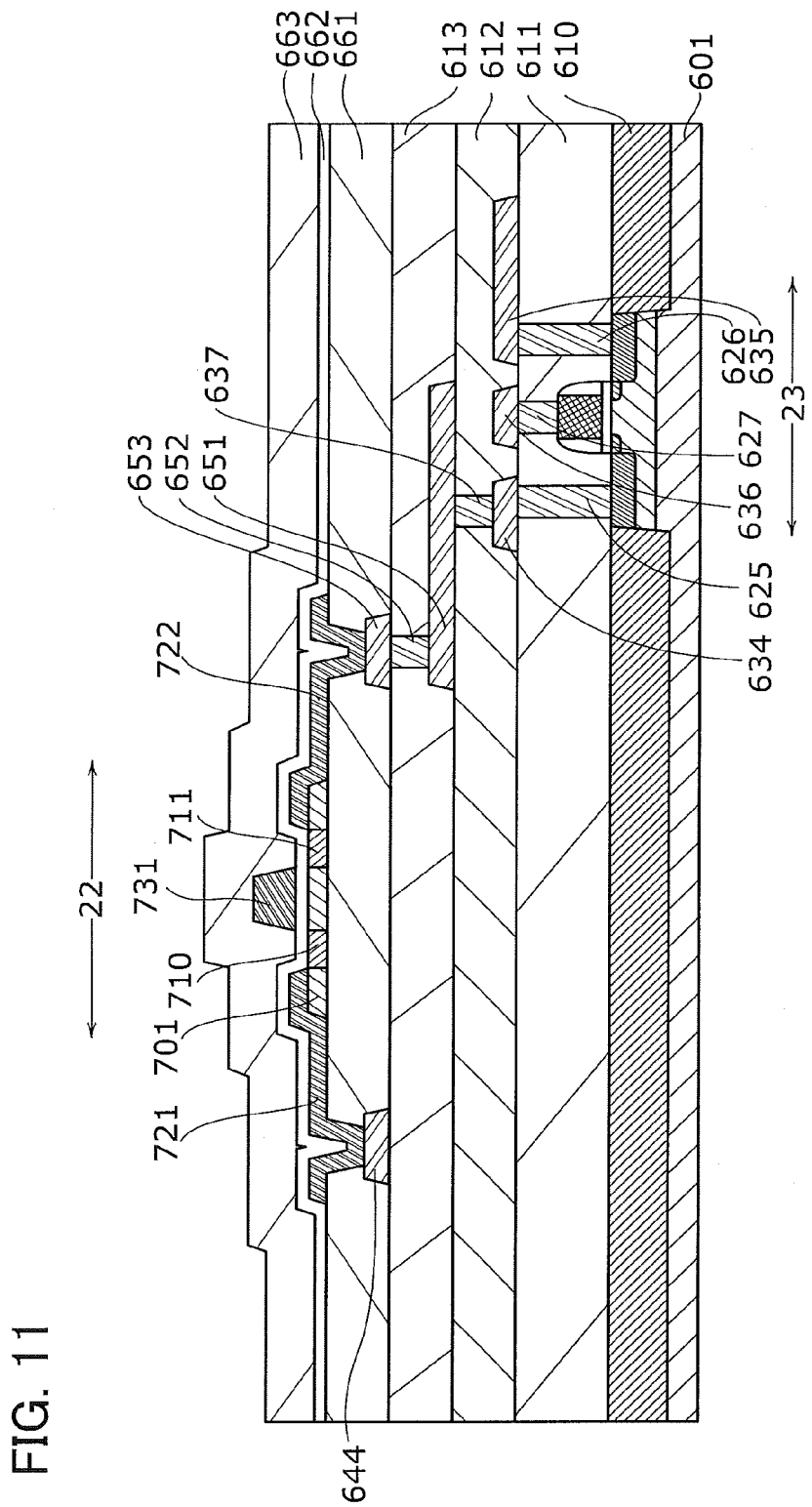
FIG. 11 shows a view illustrating a cross-sectional structure of a semiconductor device.

FIG. 11 illustrates an example of a cross-sectional structure of a semiconductor device including the dynamic logic circuit illustrated in FIG. 1 to FIG. 6, which is different from the example illustrated in FIG. 8. A transistor in which a channel is formed in an oxide semiconductor among transistors including the dynamic logic circuit is illustrated as a transistor 22. A transistor in which a channel is formed in silicon among transistors including the dynamic logic circuit is illustrated as a transistor 23. The transistor 22 is provided over the transistor 23.

The transistor 23 can be a transistor in which a channel is formed in a single crystal silicon substrate. Note that the transistor 23 may be a transistor in which a channel is formed in a semiconductor film or a semiconductor substrate of silicon, germanium, or the like that is amorphous, microcrystalline, polycrystalline, or single crystal. In the case where the transistor 23 is formed using a thin silicon film, amorphous silicon formed by a vapor phase growth method such as a plasma-enhanced CVD method or a sputtering method, polycrystalline silicon obtained by crystallization of amorphous silicon by treatment such as laser annealing, single crystal silicon obtained by separation of a surface portion by implantation of hydrogen ions or the like into a single crystal silicon wafer, or the like can be used.

The transistor 23 may include a channel formation region in an oxide semiconductor film or an oxide semiconductor substrate. In the case where all transistors included in the semiconductor device each include a channel formation region in an oxide semiconductor film or an oxide semiconductor substrate, the transistor 22 is not necessarily stacked over the transistor 23, and the transistor 22 and the transistor 23 may be formed in the same layer.

As a substrate 601 where the transistor 23 is formed, for example, a silicon substrate, a germanium substrate, a silicon germanium substrate, or the like can be used. In FIG. 11, the case where a single crystal silicon substrate is used as the substrate 601 is illustrated as an example.

In addition, the transistor 23 is electrically isolated from an adjacent transistor by an element isolation method. As the element isolation method, a local oxidation of silicon method (LOCOS method), a shallow trench isolation method (STI method), or the like can be employed. FIG. 11 illustrates, as an example, the case where the transistor 23 is electrically isolated by a trench isolation method. Specifically, FIG. 11 illustrates, as an example, the case where the transistor 23 is isolated by element isolation using an element isolation region 610 formed in such a manner that a trench is formed in the substrate 601 by etching or the like and then an insulator including silicon oxide or the like is buried in the trench.

An insulating film 611 is provided over the transistor 23. Opening portions are formed in the insulating film 611. In addition, a conductive film 625 and a conductive film 626 that are electrically connected to a source and a drain of the transistor 23 and a conductive film 627 that is electrically connected to a gate of the transistor 23 are formed in the opening portions.

In addition, the conductive film 625 is electrically connected to a conductive film 634 formed over the insulating film 611, the conductive film 626 is electrically connected to a conductive film 635 formed over the insulating film 611, and the conductive film 627 is electrically connected to a conductive film 636 formed over the insulating film 611.

An insulating film 612 is formed over the conductive film 634 to the conductive film 636. An opening portion is formed in the insulating film 612, and a conductive film 637 electrically connected to the conductive film 634 is formed in the opening portion. In addition, the conductive film 637 is electrically connected to a conductive film 651 formed over the insulating film 612.

An insulating film 613 is formed over the conductive film 651. An opening portion is formed in the insulating film 613, and a conductive film 652 electrically connected to the conductive film 651 is formed in the opening portion. In addition, the conductive film 652 is electrically connected to a conductive film 653 formed over the insulating film 613. In addition, a conductive film 644 is formed over the insulating film 613.

An insulating film 661 is formed over the conductive film 653 and the conductive film 644. In addition, the transistor 22 is formed over the insulating film 661 in FIG. 11.

The transistor 22 includes, over the insulating film 661, a semiconductor film 701 including an oxide semiconductor, a conductive film 721 and a conductive film 722 functioning as a source or a drain over the semiconductor film 701, a gate insulating film 662 over the semiconductor film 701, the conductive film 721, and the conductive film 722, and a gate electrode 731 positioned over the gate insulating film 662 and overlapping with the semiconductor film 701 between the conductive film 721 and the conductive film 722. Note that the conductive film 722 is electrically connected to the conductive film 653 in the opening portion formed in the insulating film 661.

In addition, in the semiconductor film 701 in the transistor 22, a region 710 exists between a region overlapping with the conductive film 721 and a region overlapping with the gate electrode 731. Moreover, in the semiconductor film 701 in the transistor 22, a region 711 exists between a region overlapping with the conductive film 722 and the region overlapping with the gate electrode 731. By adding a rare gas such as argon, an impurity imparting p-type conductivity to the semiconductor film 701, or an impurity imparting n-type conductivity to the semiconductor film 701 to the region 710 and the region 711 using the conductive film 721, the conductive film 722, and the gate electrode 731 as masks, the resistivity of the region 710 and the region 711 can be made lower than that of the region overlapping with the gate electrode 731 in the semiconductor film 701.

In addition, an insulating film 663 is provided over the transistor 22.

Note that in FIG. 11, the transistor 22 may include the gate electrode 731 on at least one side of the semiconductor film 701; alternatively, it may include a pair of gate electrodes with the semiconductor film 701 interposed therebetween.

In the case where the transistor 22 includes a pair of gate electrodes with the semiconductor film 701 interposed therebetween, one of the gate electrodes may be supplied with a signal for controlling the on state or the off state, and the other of the gate electrodes may be supplied with a potential from another element. In this case, potentials with the same level may be supplied to the pair of gate electrodes, or a fixed potential such as a ground potential may be supplied only to the other of the gate electrodes. By controlling the level of a potential supplied to the other of the gate electrodes, the threshold voltage of the transistor can be controlled.

Moreover, FIG. 11 illustrates, as an example, the case where the transistor 22 has a single-gate structure where one channel formation region corresponding to one gate electrode 731 is provided. However, the transistor 22 may have a multi-gate structure where a plurality of electrically connected gate electrodes are provided so that a plurality of channel formation regions are included in one active layer.

This embodiment can be implemented in free combination with any of the other embodiments.

Embodiment 9

Described here is an example of a structure of a transistor that includes a channel formation region in an oxide semiconductor film, which is different from the structures of the transistors 22 illustrated in FIG. 8 and FIG. 11, in the example of the cross-sectional structure of the semiconductor device including the dynamic logic circuits illustrated in FIG. 1 to FIG. 6.

Figure 9A:
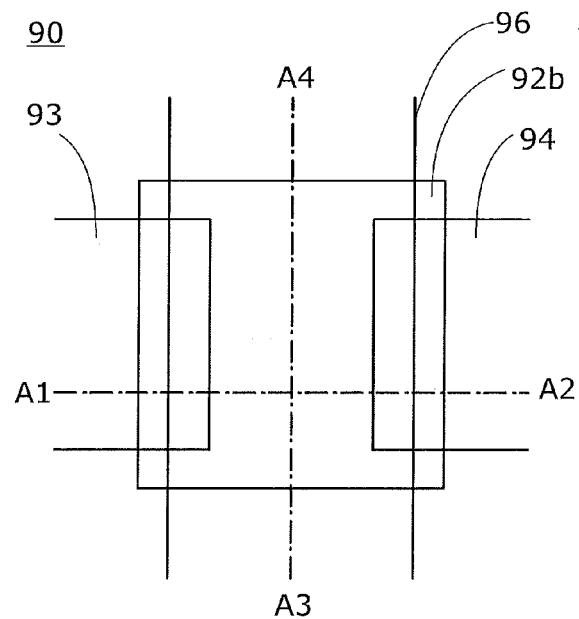
FIGS. 9A-9C show views illustrating a structure of a transistor.
Figure 9C:
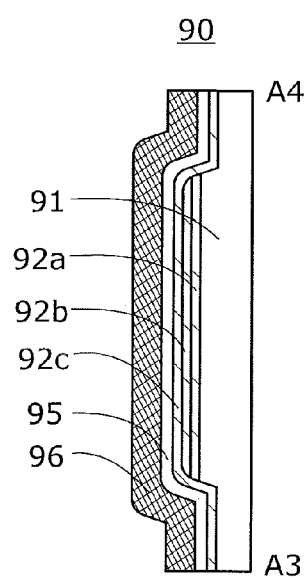
Figure 9B:
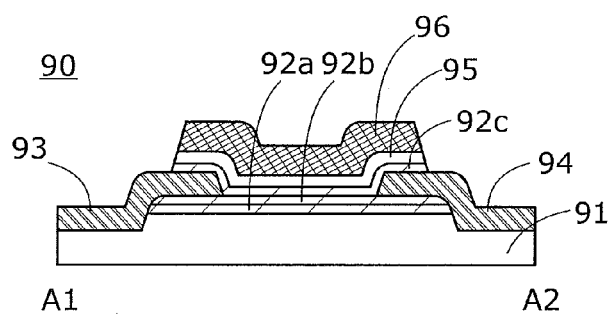

FIG. 9 illustrates a structure of a transistor 90 that includes a channel formation region in an oxide semiconductor film as an example. FIG. 9(A) is a top view of the transistor 90. Note that a variety of insulating films are omitted in FIG. 9(A) in order to clarify the layout of the transistor 90. In addition, FIG. 9(B) is a cross-sectional view along dashed line A1-A2 in the top view of FIG. 9(A), and FIG. 9(C) is a cross-sectional view along dashed line A3-A4.

As illustrated in FIG. 9, the transistor 90 includes an oxide semiconductor film 92a and an oxide semiconductor film 92b that are stacked in this order over an insulating film 91; a conductive film 93 and a conductive film 94 that are electrically connected to the oxide semiconductor film 92b and have functions as a source electrode and a drain electrode; an oxide semiconductor film 92c over the oxide semiconductor film 92b, the conductive film 93, and the conductive film 94; an insulating film 95 that has a function as a gate insulating film and is positioned over the oxide semiconductor film 92c; and a conductive film 96 that has a function as a gate electrode and overlaps with the oxide semiconductor film 92a to the oxide semiconductor film 92c over the insulating film 95. The insulating film 91 corresponds to the insulating film 422 or the like in FIG. 8. A structure of a lower layer of the insulating film 91 can be similar to that in FIG. 8. The insulating film 91 corresponds to the insulating film 661 or the like in FIG. 11. A structure of a lower layer of the insulating film 91 can be similar to that in FIG. 11.

In addition, FIG. 10 illustrates another specific example of the structure of the transistor 90. FIG. 10(A) is a top view of the transistor 90. Note that a variety of insulating films are omitted in FIG. 10(A) in order to clarify the layout of the transistor 90. In addition, FIG. 10(B) is a cross-sectional view along dashed line A1-A2 in the top view of FIG. 10(A), and FIG. 10(C) is a cross-sectional view along dashed line A3-A4.

As illustrated in FIG. 10, the transistor 90 includes the oxide semiconductor film 92a to the oxide semiconductor film 92c that are stacked in this order over the insulating film 91; the conductive film 93 and the conductive film 94 that are electrically connected to the oxide semiconductor film 92c and have functions as a source electrode and a drain electrode; the insulating film 95 that has a function as a gate insulating film and is positioned over the oxide semiconductor film 92c, the conductive film 93, and the conductive film 94; and the conductive film 96 that has a function as a gate electrode and overlaps with the oxide semiconductor film 92a to the oxide semiconductor film 92c over the insulating film 95.

Note that FIG. 9 and FIG. 10 each illustrate, as an example, a structure of the transistor 90 in which the oxide semiconductor film 92a to the oxide semiconductor film 92c that are stacked are used. The oxide semiconductor film included in the transistor 90 is not limited to a structure including a plurality of stacked oxide semiconductor films and may be formed of a single-layer oxide semiconductor film.

In the case where the transistor 90 includes the semiconductor film in which the semiconductor film 92a to the oxide semiconductor film 92c are stacked in this order, the oxide semiconductor film 92a and the oxide semiconductor film 92c are each an oxide film which contains as its component at least one of metal elements contained in the oxide semiconductor film 92b and whose energy of the conduction band minimum is closer to the vacuum level than that of the oxide semiconductor film 92b is by higher than or equal to 0.05 eV, higher than or equal to 0.07 eV, higher than or equal to 0.1 eV, or higher than or equal to 0.15 eV and lower than or equal to 2 eV, lower than or equal to 1 eV, lower than or equal to 0.5 eV, or lower than or equal to 0.4 eV. Furthermore, the oxide semiconductor film 92b preferably contains at least indium, in which case the carrier mobility is increased.

In the case where the transistor 90 includes the semiconductor film with the above-described structure, when an electric field is applied to the semiconductor film by application of voltage to a gate electrode, a channel region is formed in the oxide semiconductor film 92b whose energy of the conduction band minimum is low in the semiconductor film. That is, since the oxide semiconductor film 92c is provided between the oxide semiconductor film 92b and the insulating film 95, a channel region can be formed in the oxide semiconductor film 92b that is separated from the insulating film 95.

In addition, since the oxide semiconductor film 92c contains as its component at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in increased field-effect mobility of the transistor 90.

When an interface state is formed at the interface between the oxide semiconductor film 92b and the oxide semiconductor film 92a, a channel region is also formed in a region close to the interface; thus, the threshold voltage of the transistor 90 varies. However, since the oxide semiconductor film 92a contains as its component at least one of metal elements contained in the oxide semiconductor film 92b, an interface state is unlikely to be formed at the interface between the oxide semiconductor film 92b and the oxide semiconductor film 92a. Thus, the above-described structure can reduce variations in the electrical characteristics of the transistor 90, such as the threshold voltage.

In addition, a plurality of oxide semiconductor films are preferably stacked in order to prevent the formation of an interface state that inhibits the flow of carriers at the interfaces between the oxide semiconductor films, which is caused by impurities existing between the oxide semiconductor films. This is because when impurities exist between the stacked oxide semiconductor films, carriers are trapped or disappear due to recombination in the vicinity of the interface between the oxide semiconductor films. By reducing the impurities between the films, a continuous junction (here, in particular, a state where a U-shaped well structure in which the energy of the conduction band minimum continuously changes between the films) is easily formed.

In order to form such a continuous junction, films need to be continuously formed without being exposed to the air with a multi-chamber deposition apparatus (sputtering apparatus) including a load lock chamber. Each chamber in the sputtering apparatus is preferably evacuated to a high vacuum (to approximately $5\times10^{-7}$ Pa to $1\times10^{-4}$ Pa) by an adsorption vacuum evacuation pump such as a cryopump so that water and the like, which serve as impurities for an oxide semiconductor, are removed as much as possible. Alternatively, a turbo molecular pump and a cold trap are preferably used in combination to prevent backflow of a gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide (M is Ga, Y, Zr, La, Ce, or Nd), when the atomic ratio of metal elements in a target used for the deposition of the oxide semiconductor film 92b is In:M:Zn=$x_1$:$y_1$:$z_1$, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the oxide semiconductor film 92b. Typical examples of the atomic ratio of the metal elements of the target are In:M:Zn=1:1:1, In:M:Zn=3:1:2, and the like.

Specifically, in the case where the oxide semiconductor film 92a and the oxide semiconductor film 92c are In-M-Zn oxides (M is Ga, Y, Zr, La, Ce, or Nd), when the atomic ratio of metal elements in a target used for the deposition of the oxide semiconductor film 92a and the oxide semiconductor film 92c is In:M:Zn=$x_2$:$y_2$:$z_2$, $x_2/y_2<x_1/y_1$ is preferably satisfied, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor film 92a and the oxide semiconductor film 92c. Typical examples of the atomic ratio of the metal elements of the target are In:M:Zn=1:3:2, In:M:Zn=1:3:4, In:M:Zn=1:3:6, In:M:Zn=1:3:8, and the like.

The thicknesses of the oxide semiconductor film 92a and the oxide semiconductor film 92c are greater than or equal to 3 nm and less than or equal to 100 nm, preferably greater than or equal to 3 nm and less than or equal to 50 nm. The thickness of the oxide semiconductor film 92b is greater than or equal to 3 nm and less than or equal to 200 nm, preferably greater than or equal to 3 nm and less than or equal to 100 nm, further preferably greater than or equal to 3 nm and less than or equal to 50 nm.

In the semiconductor film with the three-layer structure, the oxide semiconductor film 92a to the oxide semiconductor film 92c can be either amorphous or crystalline. Note that when the oxide semiconductor film 92b in which a channel region is formed is crystalline, the transistor 90 can have stable electrical characteristics; thus, the oxide semiconductor film 92b is preferably crystalline.

Note that a channel formation region refers to a region of the semiconductor film of the transistor 90 that overlaps with a gate electrode and is interposed between a source electrode and a drain electrode. In addition, a channel region refers to a region through which current mainly flows in the channel formation region.

For example, in the case where an In—Ga—Zn oxide film formed by a sputtering method is used as the oxide semiconductor film 92a and the oxide semiconductor film 92c, a target that is an In—Ga—Zn oxide target (In:Ga:Zn=1:3:2 [atomic ratio]) can be used for the deposition of the oxide semiconductor film 92a and the oxide semiconductor film 92c. The deposition conditions can be, for example, as follows: an argon gas of 30 sccm and an oxygen gas of 15 sccm are used as a deposition gas; the pressure is 0.4 Pa; the substrate temperature is 200° C.; and the DC power is 0.5 kW.

In addition, in the case where the oxide semiconductor film 92b is a CAAC-OS film, a polycrystalline target containing an In—Ga—Zn oxide (In:Ga:Zn=1:1:1[atomic ratio]) is preferably used for the deposition of the oxide semiconductor film 92b. The deposition conditions can be, for example, as follows: an argon gas of 30 sccm and an oxygen gas of 15 sccm are used as the deposition gas; the pressure is 0.4 Pa; the substrate temperature is 300° C.; and the DC power is 0.5 kW.

Note that although the oxide semiconductor films 92a to 92c can be formed by a sputtering method, they may be formed by another method, for example, a theiinal CVD method. As an example of the thermal CVD method, an MOCVD (Metal Organic Chemical Vapor Deposition) method or an ALD (Atomic Layer Deposition) method may be employed.

Note that a highly purified oxide semiconductor (purified Oxide Semiconductor) obtained by reduction of impurities such as moisture and hydrogen serving as electron donors (donors) and reduction of oxygen vacancies has few carrier generation sources; therefore, it can be i-type (intrinsic semiconductor) or substantially i-type. For this reason, a transistor including a channel formation region in a highly purified oxide semiconductor film has extremely small off-state current and high reliability. In addition, a transistor in which a channel formation region is formed in the oxide semiconductor film easily has an electrical characteristic of a positive threshold voltage (also referred to as a normally-off characteristic).

Specifically, various experiments can prove small off-state current of a transistor including a channel formation region in a highly purified oxide semiconductor. For example, even when an element has a channel width of $1 \times 10^6$ μm and a channel length of 10 μm, off-state current can be less than or equal to the measurement limit of a semiconductor parameter analyzer, i.e., a feature of being lower than or equal to $1 \times 10^{-13}$ A, at voltage (drain voltage) between the source electrode and the drain electrode ranging from 1 V to 10 V. In that case, it can be seen that off-state current standardized on the channel width of the transistor is lower than or equal to 100 zA/μm. In addition, a capacitor and a transistor are connected to each other and the off-state current is measured with a circuit in which electrical charge flowing into or from the capacitor is controlled by the transistor. In the measurement, a highly purified oxide semiconductor film was used for a channel formation region of the transistor, and the off-state current of the transistor was measured from a change in the amount of electrical charge of the capacitor per unit time. As a result, it was found that, in the case where the voltage between the source electrode and the drain electrode of the transistor is 3 V, lower off-state current of several tens of yA/μm is obtained. Thus, the transistor using the highly purified oxide semiconductor film for a channel formation region has much lower off-state current than a transistor using silicon having crystallinity.

Note that in the case where an oxide semiconductor film is used as the semiconductor film, at least indium (In) or zinc (Zn) is preferably contained as an oxide semiconductor. In addition, as a stabilizer for reducing variations in electric characteristics among transistors using the oxide semiconductor film, gallium (Ga) is preferably contained in addition to them. Alternatively, Tin (Sn) is preferably contained as a stabilizer. Alternatively, Hafnium (Hf) is preferably contained as a stabilizer. Alternatively, Aluminum (Al) is preferably contained as a stabilizer. Alternatively, Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with excellent electrical characteristics can be formed by a sputtering method or a wet process. Furthermore, unlike silicon carbide, gallium nitride, or gallium oxide, the In—Ga—Zn oxide allows a transistor with excellent electrical characteristics to be formed over a glass substrate. In addition, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, as the oxide semiconductor, indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide can be used.

Note that for example, an In—Ga—Zn oxide refers to an oxide containing In, Ga, and Zn, and there is no limitation on the ratio of In to Ga and Zn. In addition, a metal element other than In, Ga, and Zn may also be contained. The In—Ga—Zn oxide has sufficiently high resistance when no electric field is applied thereto, so that off-state current can be sufficiently reduced, and it also has high mobility.

For example, high mobility can be obtained relatively easily with an In—Sn—Zn oxide. Meanwhile, even with an In—Ga—Zn oxide, the mobility can be increased by reducing the defect density in a bulk.

In the transistor 90, a metal in the source and drain electrodes might extract oxygen from the oxide semiconductor film depending on a conductive material used for the source electrode and the drain electrode. In that a case, a region of the oxide semiconductor film that is in contact with the source electrode and the drain electrode becomes an n-type region due to the formation of an oxygen vacancy. The n-type region functions as a source region or a drain region; thus, the contact resistance between the oxide semiconductor film and the source electrode and the drain electrode can be decreased. Thus, the formation of the n-type region increases the mobility and on-state current of the transistor 90, so that high-speed operation of a semiconductor device using the transistor 90 can be achieved.

Note that the extraction of oxygen by a metal in the source electrode and the drain electrode is probably caused when the source electrode and the drain electrode are formed by a sputtering method or when heat treatment is performed after the formation of the source electrode and the drain electrode. Moreover, the n-type region is more likely to be formed by using a conductive material that is easily bonded to oxygen for the source electrode and the drain electrode. Examples of the conductive material include Al, Cr, Cu, Ta, Ti, Mo, and W.

In the case where the semiconductor film including the plurality of stacked oxide semiconductor films is used in the transistor 90, the n-type region preferably extends to the oxide semiconductor film 92b serving as a channel region in order that the mobility and on-state current of the transistor 90 can be increased and high-speed operation of the semiconductor device can be achieved.

The insulating film 91 preferably has a function of supplying part of oxygen to the oxide semiconductor film 92a to the oxide semiconductor film 92c by heating. In addition, it is preferred that the number of defects in the insulating film 91 be small and typical spin density at g=2.001, which is obtained by ESR measurement, due to a dangling bond of silicon be lower than or equal to $1\times10^{18}$ spins/cm$^3$.

The insulating film 91 has a function of supplying part of oxygen to the oxide semiconductor film 92a to the oxide semiconductor film 92c by heating, and thus is preferably an oxide; for example, aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like can be used. The insulating film 91 can be formed by a plasma CVD (Chemical Vapor Deposition) method, a sputtering method, or the like.

Note that in this specification, oxynitride refers to a material that contains more oxygen than nitrogen as its composition, and nitride oxide refers to a material that contains more nitrogen than oxygen.

Note that in the transistor 90 illustrated in FIG. 9 and FIG. 10 has a structure in which the conductive film 96 overlaps with end portions of the oxide semiconductor film 92b including a channel region is formed that do not overlap with the conductive film 93 and the conductive film 94, i.e., end portions that are located in regions different from regions where the conductive film 93 and the conductive film 94 are located. When the end portions of the oxide semiconductor film 92b are exposed to plasma by etching for forming the end portions, a chlorine radical, a fluorine radical, or the like generated from an etching gas are easily bonded to a metal element contained in an oxide semiconductor. For this reason, it is though that in the end portions of the oxide semiconductor film, oxygen bonded to the metal element is easily eliminated, so that an oxygen vacancy is easily formed; thus, it easily becomes n-type. However, an electric field applied to the end portions can be controlled by controlling the potential of the conductive film 96 because the end portions of the oxide semiconductor film 92b that do not overlap with the conductive film 93 and the conductive film 94 overlap with the conductive film 96 in the transistor 90 illustrated in FIG. 9 and FIG. 10. Consequently, current that flows between the conductive film 93 and the conductive film 94 through the end portions of the oxide semiconductor film 92b can be controlled by the potential applied to the conductive film 96. Such a structure of the transistor 90 is referred to as a Surrounded Channel (S-Channel) structure.

In the case of the S-Channel structure, specifically, when a potential for selecting an off state of the transistor 90 is supplied to the conductive film 96, the amount of off-state current that flows between the conductive film 93 and the conductive film 94 through the end portions can be reduced. For this reason, in the transistor 90, even when the distance between the conductive film 93 and the conductive film 94 at the end portions of the oxide semiconductor film 92b is reduced as a result of reducing the channel length to obtain high on-state current, the transistor 90 can have low off-state current. Consequently, by reducing the channel length, the transistor 90 can have high on-state current when an on-state is selected and can have reduced off-state current when an off state is selected.

Moreover, in the case of the S-Channel structure, specifically, when a potential for selecting an on state of the transistor 90 is supplied to the conductive film 96, the amount of current that flows between the conductive film 93 and the conductive film 94 through the end portions can be increased. The current contributes to an increase in the field-effect mobility and an increase in the on-state current of the transistor 90. In addition, when the end portions of the oxide semiconductor film 92b overlap with the conductive film 96, a region of the oxide semiconductor film 92b in which carriers flow is not limited to a vicinity of the interface of the oxide semiconductor film 92b close to the insulating film 95, and carriers flow in a wide region of the oxide semiconductor film 92b; thus, the amount of carrier movement in the transistor 90 is increased. As a result, the on-state current of the transistor 90 is increased, and the field-effect mobility is increased; typically, the field-effect mobility is greater than or equal to 10 cm$^2$/V·s or to greater than or equal to 20 cm$^2$/V·s. Note that here, the field-effect mobility is not an approximate value of the mobility as the physical property of the oxide semiconductor film but is an index of current drive capability and the apparent field-effect mobility of a saturation region of the transistor.

A structure of an oxide semiconductor film is described below.

An oxide semiconductor film is classified roughly into a single-crystal oxide semiconductor film and a non-single-crystal oxide semiconductor film. The non-single-crystal oxide semiconductor film refers to an amorphous oxide semiconductor film, a microcrystalline oxide semiconductor film, a polycrystalline oxide semiconductor film, a CAAC-OS (C Axis Aligned Crystalline Oxide Semiconductor) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the microcrystalline oxide semiconductor film has a feature of lower density of defect states than that of the amorphous oxide semiconductor film.

The CAAC-OS film is an oxide semiconductor film including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

The CAAC-OS film has a feature of lower density of defect states than that of the microcrystalline oxide semiconductor film. In observation of the CAAC-OS film with a transmission electron microscope (TEM: Transmission Electron Microscope), a clear boundary between crystal parts, that is, a crystal grain boundary (also referred to as grain boundary) cannot be observed. Thus, it can be said that in the CAAC-OS film, a reduction in electron mobility due to the grain boundary is less likely to occur.

According to the observation of the CAAC-OS film with TEM in a direction substantially parallel to a sample surface (cross-sectional TEM observation), metal atoms are arranged in a layered manner in the crystal parts. Each metal atom layer has a morphology reflecting unevenness of a surface over which the CAAC-OS film is formed (also referred to as a formation surface) or a top surface, and is arranged parallel to the formation surface or the top surface of the CAAC-OS film.

In this specification, "parallel" a state where the angle formed between two straight lines is greater than or equal to −10° and less than or equal to 10°. Accordingly, the case where the angle is greater than or equal to −5° and less than or equal to 5° is also included. In addition, the term "substantially parallel" indicates a state where the angle formed between two straight lines is greater than or equal to 80° and less than or equal to 100°. Accordingly, the case where the angle is greater than or equal to 85° and less than or equal to 95° is also included.

On the other hand, according to the observation of CAAC-OS film with TEM in a direction substantially perpendicular to the sample surface (plan-view TEM observation), metal atoms are arranged in a triangular or hexagonal configuration in the crystal parts. However, there is no regularity of arrangement of metal atoms between different crystal parts.

The cross-sectional TEM observation and the plan-view TEM observation show that the crystal parts in the CAAC-OS film has alignment.

When a CAAC-OS film is subjected to structural analysis with an X-ray diffraction (XRD: X-Ray Diffraction) apparatus, in analysis of the CAAC-OS film including an InGaZnO$_4$ crystal by an out-of-plane method, a peak appears at a diffraction angle (2θ) of around 31° in some cases. This peak is attributed to the (009) plane of the InGaZnO$_4$ crystal, which indicates that crystals in the CAAC-OS film have c-axis alignment and that the c-axes are aligned in a direction substantially perpendicular to the formation surface or the top surface.

On the other hand, in analysis of the CAAC-OS film by an in-plane method in which an X-ray enters in a direction substantially perpendicular to the c-axis, a peak appears frequently at 2θ of around 56°. This peak is attributed to the (110) plane of the InGaZnO$_4$ crystal. When analysis (φ scan) is performed while the sample is rotated around a normal vector of a sample surface as an axis (φ axis) with 2θ fixed at around 56°, six peaks attributed to crystal planes equivalent to the (110) plane are observed in the case of a single crystal oxide semiconductor film of InGaZnO$_4$. On the other hand, in the case of a CAAC-OS film, a clear peak does not appear even when θ scan is performed with 2θ fixed at around 56°.

According to the above, in the CAAC-OS film having c-axis alignment, while the directions of a-axes and b-axes are irregularly oriented between crystal parts, the c-axes are aligned in a direction parallel to a normal vector of a formation surface or f a top surface. Thus, each metal atom layer arranged in a layered manner observed in the above-described cross-sectional TEM observation corresponds to a plane parallel to the a-b plane of the crystal.

Note that the crystal part is formed when the CAAC-OS film is deposited or crystallization treatment such as heat treatment is performed. As described above, the c-axis of the crystal is aligned in a direction parallel to a normal vector of a formation surface or a top surface of the CAAC-OS film. Thus, for example, in the case where the shape of the CAAC-OS film is changed by etching or the like, the c-axis is not necessarily parallel to a normal vector of a formation surface or a top surface of the CAAC-OS film.

In addition, the degree of crystallinity in the CAAC-OS film is not necessarily uniform. For example, in the case where the crystal part of the CAAC-OS film is formed by crystal growth from the vicinity of the top surface of the CAAC-OS film, the degree of crystallinity in the vicinity of the top surface is higher than that in the vicinity of the formation surface in some cases. Furthermore, in the case where an impurity is added to the CAAC-OS film, the degree of crystallinity in a region to which the impurity is added is changed, and regions in which the degree of crystallinity vary are formed in some cases.

Note that in analysis of the CAAC-OS film including an InGaZnO$_4$ crystal is by an out-of-plane method, a peak of 2θ might appear at around 36°, in addition to the peak of 2θ at around 31°. The peak of 2θ at around 36° indicates that a crystal having no c-axis alignment is included in part of the CAAC-OS film. It is preferred that in the CAAC-OS film, a peak of 2θ appear at around 31° and a peak of 2θ not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

In addition, for the deposition of the CAAC-OS film, the following conditions are preferably used.

By reducing entry of impurities at the time of the deposition, the crystal state can be prevented from being broken by the impurities. For example, the concentration of impurities (hydrogen, water, carbon dioxide, nitrogen, and the like) that exist in a treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature at the time of the deposition, migration of a sputtered particle occurs after it reaches a substrate surface. Specifically, the deposition is performed at a substrate heating temperature of higher than or equal to 100° C. and lower than or equal to 740° C., preferably higher than or equal to 200° C. and lower than or equal to 500° C. By increasing the substrate heating temperature at the time of the deposition, when the flat-plate-like sputtered particles reach the substrate, migration occurs on the substrate, so that a flat plane of the flat-plate-like sputtered particle is attached to the substrate.

Furthermore, it is preferred that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder at a predetermined molar ratio, performing pressure treatment, and performing heat treatment at a temperature of higher than or equal to 1000° C. and lower than or equal to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, 2:1:3, or 3:1:2. Note that the kinds of powder and the molar ratio for mixing powder may be determined as appropriate depending on the desired target. In particular, a CAAC-OS film formed using a target with a molar ratio of In to Ga and Zn of 2:1:3 can have a high proportion of regions where a diffraction pattern of CAAC-OS is observed in a predetermined area (also referred to as proportion of CAAC); thus, a transistor including a channel formation region in the CAAC-OS film can have improved frequency characteristics (f characteristics).

Note that an alkali metal is not an element included in an oxide semiconductor and thus is an impurity. An alkaline earth metal is also an impurity in the case where it is not a component of the oxide semiconductor. An alkali metal, in particular, Na becomes $Na^+$ when an insulating film in contact with the oxide semiconductor film is an oxide and Na diffuses into the insulating film. In addition, in the oxide semiconductor film, Na cuts or enters a bond between a metal and oxygen that are included in the oxide semiconductor. As a result, for example, degradation of electrical characteristics of a transistor, such as a normally-on state due to shift of the threshold voltage in the negative direction or reduction in mobility, occurs, and variations in electrical characteristics also occur. Specifically, the measurement value of Na concentration by secondary ion mass spectrometry is preferably lower than or equal to $5\times10^{16}/cm^3$, further preferably lower than or equal to $1\times10^{16}/cm^3$, still further preferably lower than or equal to $1\times10^{15}/cm^3$. In a similar manner, the measurement value of Li concentration is preferably lower than or equal to $5\times10^{15}/cm^3$, further preferably lower than or equal to $1\times10^{15}/cm^3$. In a similar manner, the measurement value of K concentration is preferably lower than or equal to $5\times10^{15}/cm^3$, further preferably lower than or equal to $1\times10^{15}/cm^3$.

In the case where a metal oxide containing indium is used, silicon or carbon having higher bond energy with oxygen than indium might cut the bond between indium and oxygen, so that an oxygen vacancy is formed. For this reason, when silicon or carbon is contained in the oxide semiconductor film, the electric characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably lower than or equal to $1\times10^{18}/cm^3$. In the structure, the deterioration of the electric characteristics of the transistor can be prevented, so that the reliability of a semiconductor device can be improved.

This embodiment can be implemented in free combination with any of the other embodiments.

Embodiment 10

The semiconductor device of one embodiment of the present invention can be used for display devices, personal computers, image reproducing devices provided with recording media (typically, devices that reproduce the recording media such DVD: Digital Versatile Discs and have displays for displaying the images), or the like. Other than the above, as an electronic appliance that can be used for the semiconductor device of one embodiment of the present invention, mobile phones, game machines including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical equipment, and the like can be given. Specific examples of these electronic appliances are illustrated in FIG. 12.

Figure 12A:
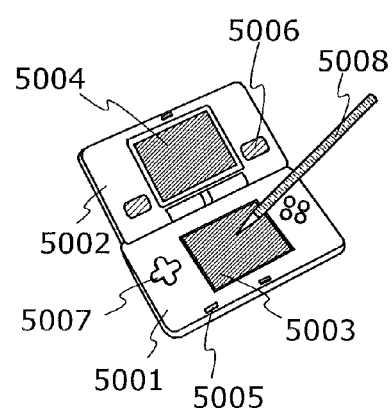
FIGS. 12A-12F show views of electronic appliances.

FIG. 12(A) is a portable game console including a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in the portable game console. Note that although the portable game console illustrated in FIG. 12(A) has the two display portions 5003 and 5004, the number of display portions included in the portable game console is not limited thereto.

Figure 12B:
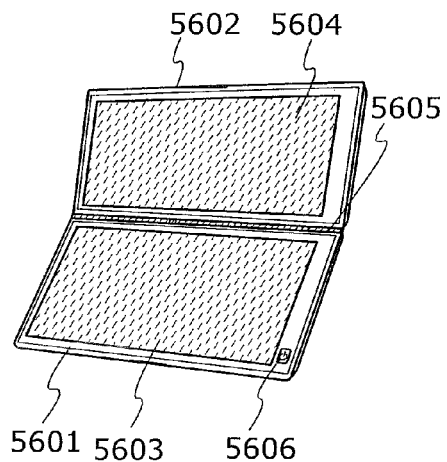

FIG. 12(B) is a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in the portable information terminal. The first display portion 5603 is provided in the first housing 5601, and the second display portion 5604 is provided in the second housing 5602. In addition, the first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by providing a photoelectric conversion element that is also called a photosensor in a pixel portion of a display device.

Figure 12C:
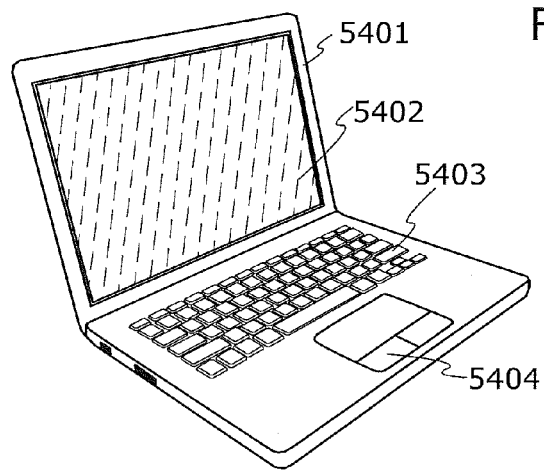

FIG. 12(C) is a laptop personal computer including a housing 5401, a display portion 5402, a keyboard 5403, a pointing device 5404, and the like. The semiconductor device of one embodiment of the present invention can be used for a variety of integrated circuits included in the laptop personal computer.

Figure 12D:
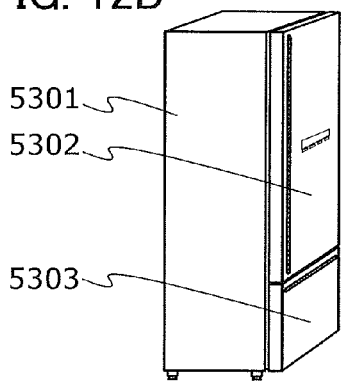

FIG. 12(D) is an electric refrigerator-freezer including a housing 5301, a refrigerator door 5302, a freezer door 5303, and the like. The semiconductor device of one embodiment of the present invention can be used for a variety of integrated circuits included in the electric refrigerator-freezer.

Figure 12E:
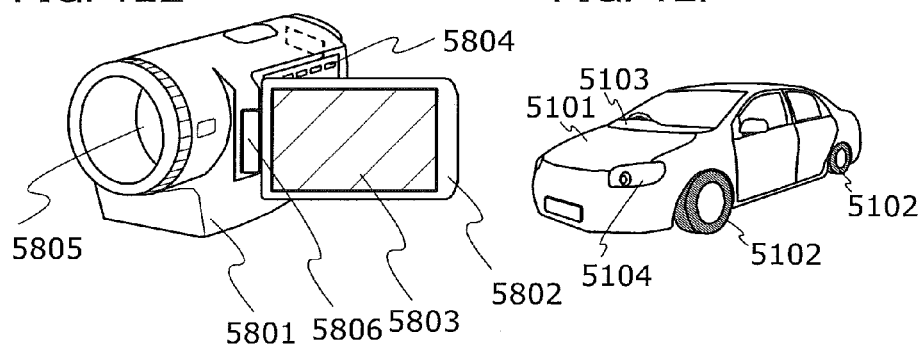

FIG. 12(E) is a video camera including a first housing 5801, a second housing 5802, a display portion 5803, an operation key 5804, a lens 5805, a joint 5806, and the like. The semiconductor device of one embodiment of the present invention can be used for a variety of integrated circuits included in the video camera. The operation key 5804 and the lens 5805 are provided in the first housing 5801, and the display portion 5803 is provided in the second housing 5802. In addition, the first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 12F:
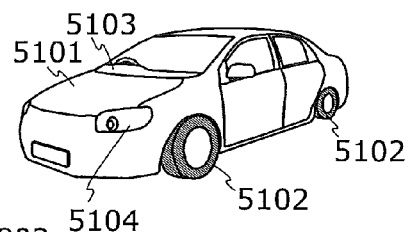

FIG. 12(F) is passenger car including a car body 5101, wheels 5102, a dashboard 5103, lights 5104, and the like. The semiconductor device of one embodiment of the present invention can be used for a variety of integrated circuits included in the passenger car.

For example, in this specification and the like, when it is explicitly described that X and Y are connected, the case where X and Y are electrically connected, the case where X and Y are functionally connected, and the case where X and Y are directly connected are included therein. Accordingly, a connection relation other than connection relations shown in the drawings and texts is also included, without being limited to a predetermined connection relation, for example, a connection relation shown in the drawings and texts.

Here, X, Y, and the like to be used are each an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, a load, or the like) can be connected between X and Y. Note that a switch has a function of being controlled to be on or off. That is, a switch is in a conduction state (on state) or a non-conduction state (off state) to determine whether or not current flows therethrough. Alternatively, the switch has a function of selecting and changing a path through which current flows.

As an example of the case where X and Y are functionally connected, one or more circuits that enable functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up converter, a step-down converter, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit, and/or the like) can be connected between X and Y. Note that, for example, in the case where a signal output from X is transmitted to Y even when another circuit is interposed between X and Y, X and Y are functionally connected.

Note that in the case where it is explicitly described that X and Y are electrically connected, the case where X and Y are electrically connected (i.e., the case where X and Y are connected with another element or another circuit interposed therebetween), the case where X and Y are functionally connected (i.e., the case where X and Y are functionally connected with another circuit interposed therebetween), and the case where X and Y are directly connected (i.e., the case where X and Y are connected without another element or another circuit interposed therebetween) are included therein. That is, when it is explicitly described that X and Y are electrically connected, the description is the same as the case where it is explicitly only described that X and Y are connected.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed as follows.

For example, the expression "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order" can be used. Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order" can be used. When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation to these expressions. Here, X, Y, Z1, and Z2 are each an object (e.g., a device, an element, a circuit, a wiring, an electrode, a terminal, a conductive film, a layer, or the like).

Note that even when independent components are electrically connected to each other in a circuit diagram, one component has functions of a plurality of components in some cases. For example, when part of a wiring also functions as an electrode, one conductive film functions as both the wiring and the electrode. Thus, electrical connection in this specification includes in its category such a case where one conductive film has functions of a plurality of components.

This embodiment can be implemented in free combination with any of the other embodiments.

This application is based on Japanese Patent Application serial No. 2014-042527 filed with the Japan Patent Office on Mar. 5, 2014, the entire contents of which are hereby incorporated by reference.

What is claimed is:

1. A semiconductor device comprising:
a first circuit;
a second circuit; and
a third circuit,
wherein:
the first circuit comprises a first terminal, a second terminal, and a third terminal;
the first circuit selects a conduction state or a non-conduction state between the first terminal and the second terminal in accordance with a signal input to the third terminal;
the first terminal is electrically connected to a first wiring;
the first wiring supplies a first potential;
the second circuit comprises a fourth terminal, a fifth terminal, and a sixth terminal;
the second circuit selects a conduction state or a non-conduction state between the fourth terminal and the fifth terminal in accordance with a data signal input to the sixth terminal;
the fourth terminal is electrically connected to the second terminal;
the third circuit comprises a seventh terminal, an eighth terminal, and a ninth terminal;
the third circuit selects a conduction state or a non-conduction state between the seventh terminal and the eighth terminal in accordance with a signal input to the ninth terminal;
the seventh terminal is electrically connected to the fifth terminal;
the eighth terminal is electrically connected to a second wiring;
the second wiring supplies a second potential;
when the first terminal and the second terminal are in a conduction state, a non-conduction state between the seventh terminal and the eighth terminal is established;
when the first terminal and the second terminal are in a non-conduction state, a conduction state between the seventh terminal and the eighth terminal is established;
the first circuit comprises a first transistor;
the second circuit comprises a second transistor;
the third circuit comprises a third transistor,
a channel formation region of the first transistor comprises silicon;
a channel formation region of the second transistor comprises silicon; and
a channel formation region of the third transistor comprises an oxide semiconductor.

2. The semiconductor device according to claim 1, wherein the third transistor is provided over at least one of the first transistor and the second transistor.

3. A semiconductor device comprising:
a first circuit;
a second circuit; and
a third circuit,
wherein:
the first circuit comprises a first terminal, a second terminal, and a third terminal;
the first circuit selects a conduction state or a non-conduction state between the first terminal and the second terminal in accordance with a signal input to the third terminal;
the first terminal is electrically connected to a first wiring;
the first wiring supplies a first potential;
the second circuit comprises a fourth terminal, a fifth terminal, and a sixth terminal;
the second circuit selects a conduction state or a non-conduction state between the fourth terminal and the fifth terminal in accordance with a data signal input to the sixth terminal;
the fourth terminal is electrically connected to the second terminal;
the third circuit comprises a seventh terminal, an eighth terminal, and a ninth terminal;
the third circuit selects a conduction state or a non-conduction state between the seventh terminal and the eighth terminal in accordance with a signal input to the ninth terminal;
the seventh terminal is electrically connected to the fifth terminal;
the eighth terminal is electrically connected to a second wiring;
the second wiring supplies a second potential;
when the first terminal and the second terminal are in a conduction state, a non-conduction state between the seventh terminal and the eighth terminal is established;
when the first terminal and the second terminal are in a non-conduction state, a conduction state between the seventh terminal and the eighth terminal is established;
the first circuit comprises a first transistor;
the second circuit comprises a second transistor;
the third circuit comprises a third transistor,
a channel formation region of the first transistor comprises silicon;
a channel formation region of the second transistor comprises an oxide semiconductor; and
a channel formation region of the third transistor comprises silicon.

4. The semiconductor device according to claim 3, wherein the second transistor is provided over at least one of the first transistor and the third transistor.

5. A semiconductor device comprising:
a first circuit;
a second circuit; and
a third circuit,
wherein:
the first circuit comprises a first terminal, a second terminal, and a third terminal;
the first circuit selects a conduction state or a non-conduction state between the first terminal and the second terminal in accordance with a signal input to the third terminal;
the first terminal is electrically connected to a first wiring;
the first wiring supplies a first potential;
the second circuit comprises a fourth terminal, a fifth terminal, and a sixth terminal;
the second circuit selects a conduction state or a non-conduction state between the fourth terminal and the fifth terminal in accordance with a data signal input to the sixth terminal;
the fourth terminal is electrically connected to the second terminal;

the third circuit comprises a seventh terminal, an eighth terminal, and a ninth terminal;

the third circuit selects a conduction state or a non-conduction state between the seventh terminal and the eighth terminal in accordance with a signal input to the ninth terminal;

the seventh terminal is electrically connected to the fifth terminal;

the eighth terminal is electrically connected to a second wiring;

the second wiring supplies a second potential;

when the first terminal and the second terminal are in a conduction state, a non-conduction state between the seventh terminal and the eighth terminal is established;

when the first terminal and the second terminal are in a non-conduction state, a conduction state between the seventh terminal and the eighth terminal is established;

the first circuit comprises a first transistor;

the second circuit comprises a second transistor;

the third circuit comprises a third transistor, a channel formation region of the first transistor comprises silicon;

a channel formation region of the second transistor comprises an oxide semiconductor; and a channel formation region of the third transistor comprises an oxide semiconductor.

6. The semiconductor device according to claim 5, wherein at least one of the second transistor and the third transistor is provided over the first transistor.

7. The semiconductor device according to claim 2, wherein the third transistor and at least one of the first transistor and the second transistor overlap with each other.

8. The semiconductor device according to claim 1, further comprising an insulating film over at least one of the first transistor and the second transistor,
wherein the third transistor is provided over the insulating film.

9. The semiconductor device according to claim 8, wherein a top surface of the insulating film is planarized.

10. The semiconductor device according to claim 4, wherein the second transistor and at least one of the first transistor and the third transistor overlap with each other.

11. The semiconductor device according to claim 3, further comprising an insulating film over at least one of the first transistor and the third transistor,
wherein the second transistor is provided over the insulating film.

12. The semiconductor device according to claim 11, wherein a top surface of the insulating film is planarized.

13. The semiconductor device according to claim 6, wherein the first transistor and at least one of the second transistor and the third transistor overlap with each other.

14. The semiconductor device according to claim 5, further comprising an insulating film over the first transistor,
wherein at least one of the second transistor and the third transistor is provided over the insulating film.

15. The semiconductor device according to claim 14, wherein a top surface of the insulating film is planarized.

* * * * *